(12) United States Patent
Wallace et al.

(10) Patent No.: US 10,211,088 B2
(45) Date of Patent: Feb. 19, 2019

(54) SELF-ALIGNED ISOTROPIC ETCH OF PRE-FORMED VIAS AND PLUGS FOR BACK END OF LINE (BEOL) INTERCONNECTS

(71) Applicants: INTEL CORPORATION, Santa Clara, CA (US); Charles H. Wallace, Portland, OR (US); Swaminathan Sivakumar, Beaverton, OR (US)

(72) Inventors: Charles H. Wallace, Portland, OR (US); Elliot N. Tan, Portland, OR (US); Paul A. Nyhus, Portland, OR (US); Swaminathan Sivakumar, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/743,616

(22) PCT Filed: Sep. 10, 2015

(86) PCT No.: PCT/US2015/049498
§ 371 (c)(1),
(2) Date: Jan. 10, 2018

(87) PCT Pub. No.: WO2017/044106
PCT Pub. Date: Mar. 16, 2017

(65) Prior Publication Data
US 2018/0204763 A1   Jul. 19, 2018

(51) Int. Cl.
*H01L 21/768* (2006.01)
*H01L 23/522* (2006.01)
(Continued)

(52) U.S. Cl.
CPC .... *H01L 21/76802* (2013.01); *H01L 21/0337* (2013.01); *H01L 21/31111* (2013.01);
(Continued)

(58) Field of Classification Search
CPC ......... H01L 21/76802; H01L 21/76879; H01L 21/76816; H01L 21/76801;
(Continued)

(56) References Cited

U.S. PATENT DOCUMENTS 9,054,164 B1 *  6/2015  Jezewski ........... H01L 21/76879
9,236,292 B2 *  1/2016  Romero ............ H01L 21/76838
(Continued)

FOREIGN PATENT DOCUMENTS

| JP | 2004-214228 | 7/2004 |
| KR | 10-2013-0065264 | 6/2013 |
| KR | 10-2014-0072434 | 6/2014 |

OTHER PUBLICATIONS

International Preliminary Search Report for PCT/US15/49498 dated Mar. 22, 2018, 7 pages.
(Continued)

*Primary Examiner* — Michael M Trinh
(74) *Attorney, Agent, or Firm* — Schwabe, Williamson & Wyatt, P.C.

(57) ABSTRACT

Self-aligned isotropic etch processes for via and plug patterning for back end of line (BEOL) interconnects, and the resulting structures, are described. In an example, a method of fabricating an interconnect structure for an integrated circuit includes removing a sacrificial or permanent placeholder material of a subset of a plurality of holes or trenches through openings in a patterning layer. The method also includes removing the patterning layer and filling the subset of the plurality of holes or trenches with a permanent material.

20 Claims, 21 Drawing Sheets

(51) Int. Cl.
*H01L 21/311* (2006.01)
*H01L 23/528* (2006.01)
*H01L 21/033* (2006.01)

(52) U.S. Cl.
CPC .. *H01L 21/31144* (2013.01); *H01L 21/76801* (2013.01); *H01L 21/76816* (2013.01); *H01L 21/76877* (2013.01); *H01L 21/76879* (2013.01); *H01L 21/76897* (2013.01); *H01L 23/528* (2013.01); *H01L 23/5226* (2013.01)

(58) Field of Classification Search
CPC ......... H01L 21/76897; H01L 21/76877; H01L 21/31111; H01L 21/31144; H01L 23/5226; H01L 23/528
See application file for complete search history.

(56) References Cited

U.S. PATENT DOCUMENTS

| | | | |
|---|---|---|---|
| 9,466,563 B2 * | 10/2016 | Mignot | ............... H01L 23/5226 |
| 2014/0015143 A1 * | 1/2014 | Liu | ......................... H01L 43/12 |
| | | | 257/774 |
| 2014/0061811 A1 | 3/2014 | Chien et al. | |
| 2016/0190009 A1 * | 6/2016 | Wallace | ........... H01L 21/76897 |
| | | | 257/774 |

OTHER PUBLICATIONS

International Search Report and Written Opinion for International Patent Application No. PCT/US2015/049498 dated May 30, 2016, 10 pgs.

* cited by examiner

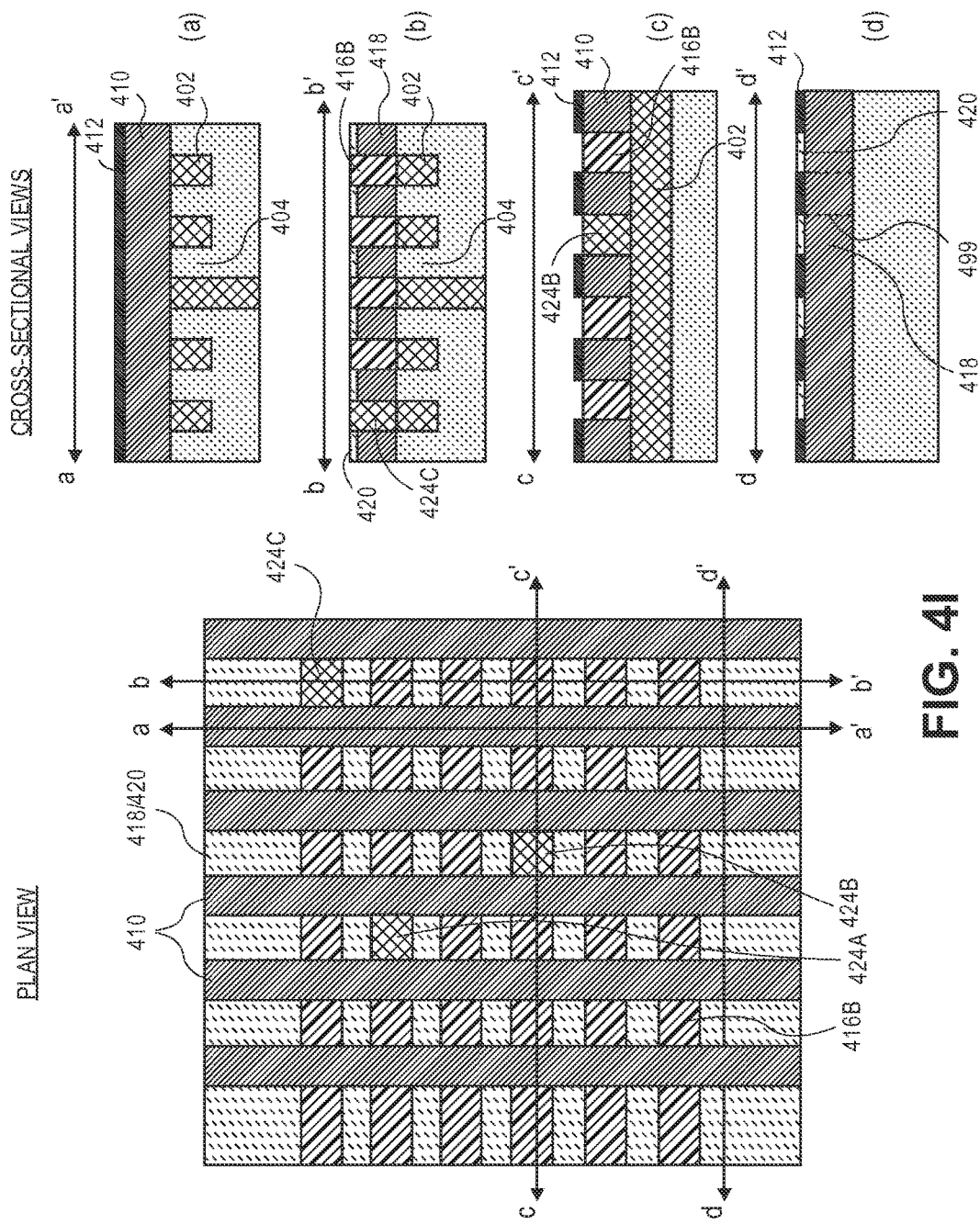

SELF-ALIGNED ISOTROPIC ETCH OF PRE-FORMED VIAS AND PLUGS FOR BACK END OF LINE (BEOL) INTERCONNECTS

CROSS-REFERENCE TO RELATED APPLICATION

This patent application is a U.S. National Phase Application under 35 U.S.C. § 371 of International Application No. PCT/US2015/049498, filed Sep. 10, 2015, entitled "SELF-ALIGNED ISOTROPIC ETCH OF PRE-FORMED VIAS AND PLUGS FOR BACK END OF LINE (BEOL) INTERCONNECTS," which designates the United States of America, the entire disclosure of which is hereby incorporated by reference in its entirety and for all purposes.

TECHNICAL FIELD

Embodiments of the invention are in the field of semiconductor structures and processing and, in particular, self-aligned isotropic etch processes for via and plug patterning for back end of line (BEOL) interconnects, and the resulting structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be modeled sufficiently accurately, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners.

Improvements are needed in the area of back end metallization manufacturing technologies for fabricating metal lines, metal vias, and dielectric plugs.

BRIEF DESCRIPTION OF THE DRAWINGS

FIG. 1A illustrates a plan view and corresponding cross-sectional view of a starting structure following pre-patterning of holes/trenches in a substrate or layer;

FIG. 1B illustrates a plan view and corresponding cross-sectional view of the structure of FIG. 1A following the filling of holes/trenches with a sacrificial or permanent placeholder material;

FIG. 1C illustrates a plan view and corresponding cross-sectional view of the structure of FIG. 1B following the formation of a patterning layer;

FIG. 1D illustrates a plan view and corresponding cross-sectional view of the structure of FIG. 1C following patterning of the patterning layer to form openings in the patterning layer;

FIG. 1E illustrates a plan view and corresponding cross-sectional view of the structure of FIG. 1D following removal of the sacrificial or permanent placeholder material in locations exposed by the openings to form re-exposed holes/trenches;

FIG. 1F illustrates a plan view and corresponding cross-sectional view of the structure of FIG. 1E following removal of the patterning layer; and FIG. 1G illustrates a plan view and corresponding cross-sectional view of the structure of FIG. 1F following the filling of the re-exposed holes/trenches.

FIG. 2A illustrates a starting structure following filling of all possible via locations with a placeholder material;

FIG. 2B illustrates the structure of FIG. 2A following patterning of the mask layer to form openings in the mask layer; and FIG. 2C illustrates the structure of FIG. 2B following removal of the sacrificial placeholder material in locations exposed by the openings to form exposed via locations 216.

FIGS. 4A-4M illustrate portions of integrated circuit layers representing various operations in a method of self-aligned via and metal patterning, in accordance with an embodiment of the present invention, where:

FIG. 4A illustrates a plan view and corresponding cross-sectional views of options for a previous layer metallization structure;

FIG. 4B illustrates a plan view and corresponding cross-sectional views of the structure of FIG. 4A following formation of interlayer dielectric (ILD) lines above the structure of FIG. 4A;

FIG. 4C illustrates a plan view and corresponding cross-sectional views of the structure of FIG. 4B following selective differentiation all of the potential via locations from all of the plug locations;

FIG. 4D illustrates a plan view and corresponding cross-sectional views of the structure of FIG. 4C following differential polymer addition to the exposed portions of underlying metal and ILD lines of FIG. 4C;

FIG. 4E illustrates a plan view and corresponding cross-sectional views of the structure of FIG. 4D following removal of one species of polymer;

FIG. 4F illustrates a plan view and corresponding cross-sectional views of the structure of FIG. 4E following formation of an ILD material in the locations opened upon removal of the one species of polymer;

FIG. 4G illustrates a plan view and corresponding cross-sectional views of the structure of FIG. 4F following formation of a mask layer with openings patterned therein;

FIG. 4H illustrates a plan view and corresponding cross-sectional views of the structure of FIG. 4G following opening of the selected via locations and mask removal;

FIG. 4I illustrates a plan view and corresponding cross-sectional views of the structure of FIG. 4H following via formation;

FIG. 4J illustrates a plan view and corresponding cross-sectional views of the structure of FIG. 4I following removal of the second species of polymer and replacement with an ILD material;

FIG. 4K illustrates a plan view and corresponding cross-sectional views of the structure of FIG. 4J following patterning of a resist or mask in selected plug locations;

FIG. 4L illustrates a plan view and corresponding cross-sectional views of the structure of FIG. 4K following hardmask removal and ILD layer recessing;

FIG. 4M illustrates a plan view and corresponding cross-sectional views of the structure of FIG. 4L following metal line formation.

DESCRIPTION OF THE EMBODIMENTS

Figure 1A:
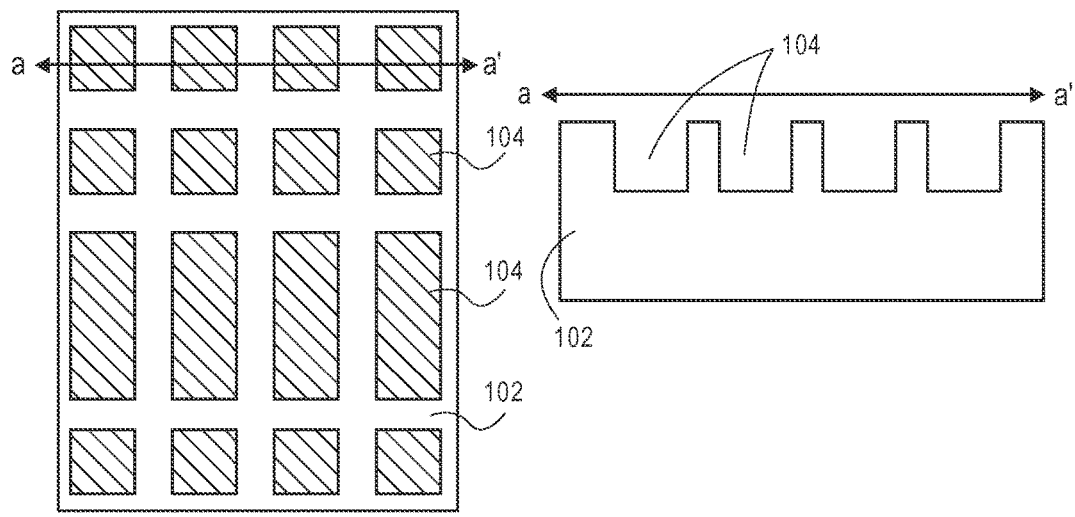
FIGS. 1A-1G illustrate portions of integrated circuit layers representing various operations in a method involving self-aligned isotropic etching of pre-formed via or plug locations, in accordance with an embodiment of the present invention, where.

Self-aligned isotropic etch processes for via and plug patterning for back end of line (BEOL) interconnects, and the resulting structures, are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be appreciated that the various embodiments shown in the Figures are illustrative representations and are not necessarily drawn to scale.

One or more embodiments described herein are directed to self-aligned via and plug patterning. The self-aligned aspect of the processes described herein may be based on a directed self-assembly (DSA) mechanism, as described in greater detail below. However, it is to be appreciated that selective growth mechanisms may be employed in place of, or in combination with, DSA-based approaches. In an embodiment, processes described herein enable realization of self-aligned metallization for back-end of line feature fabrication.

Embodiments described herein may be directed to self-aligned isotropic etch processing of pre-formed vias or plugs, or both. For example, a processing scheme may involve pre-formation of every possible via and plug in a metallization layer, such as a back end of line metallization layer of a semiconductor structure. Lithography is then employed to select specific via and/or plug locations to open/close (e.g., keep/remove). Implementation of embodiments described herein can involve the use of such an etch scheme to form all vias/plugs in a photo-bucket arrangement for every corresponding via/metal layer in a metallization stack. As will be appreciated, vias may be formed in a layer different from a layer than plugs are formed in (e.g., the latter being formed in a metal line layer that is vertically between via layers), or plugs and vias may be formed in a same layer.

To provide context, issues associated with across die/wafer etch non-uniformity can reduce yield and/or performance of fabricated semiconductor structures. One or more embodiments described herein offer a more efficient approach to patterning by maximizing the overlay process window, minimizing the size and shape of required patterns, and increasing the efficiency of the lithography process to pattern holes or plugs.

In a more specific embodiment, a pattern needed to open a pre-formed via or plug location can be made to be relatively small, enabling an increase in the overlay margin of a lithographic process. The pattern features can be made of uniform size, which can reduce scan time on direct write ebeam and/or optical proximity correction (OPC) complexity with optical lithography. The pattern features can also be made to be shallow, which can improve the patterning resolution. A subsequently performed etch process may be an isotropic chemically selective etch. Such an etch process mitigates otherwise associated with profile and critical dimension and mitigates anisotropic issues typically associated with dry etch approaches. Such an etch process is also relatively much less expensive from an equipment and throughput perspective as compared to other selective removal approaches.

To provide broader context, patterning and aligning of features at less than approximately 50 nanometer pitch requires many reticles and critical alignment strategies that are extremely expensive for a semiconductor manufacturing process. Generally, embodiments described herein involve the fabrication of metal and via patterns based on the positions of an underlying layer. That is, in contrast to conventional top-down patterning approaches, a metal interconnect process is effectively reversed and built from the previous layer up. This is in contrast to a conventional approach such as dual damascene metallization where an interlayer dielectric (ILD) is first deposited, with a pattern for metal and via layers subsequently patterned therein. In the conventional approach, alignment to a previous layer is performed using a lithography scanner alignment system. The ILD is then etched.

More specifically, one or more embodiments are directed to an approach that employs an underlying metal as a template to build the conductive vias and non-conductive spaces or interruptions between metals (referred to as "plugs"). Vias, by definition, are used to land on a previous layer metal pattern. In this vein, embodiments described herein enable a more robust interconnect fabrication scheme since alignment by lithography equipment is no longer relied on.

Such an interconnect fabrication scheme can be used to save numerous alignment/exposures, can be used to improve electrical contact (e.g., by reducing via resistance), and can be used to reduce total process operations and processing time otherwise required for patterning such features using conventional approaches.

As an exemplary general processing scheme, FIGS. 1A-1G illustrate portions of integrated circuit layers representing various operations in a method involving self-aligned isotropic etching of pre-formed via or plug locations, in accordance with an embodiment of the present invention. In each illustration at each described operation, plan views are shown on the left-hand side, and corresponding cross-sectional views are shown on the right-hand side. These views will be referred to herein as corresponding cross-sectional views and plan views.

FIG. 1A illustrates a plan view and corresponding cross-sectional view (taken along the a-a' axis) of a starting structure following pre-patterning of holes/trenches 104 in a substrate or layer 102. In one embodiment, the substrate or layer 102 is an inter-layer dielectric (ILD) material layer.

Although not depicted for simplicity, it is to be appreciated that the holes/trenches 104 may expose underlying features, such as underlying metal lines. Furthermore, in an embodiment, the starting structure may be patterned in a grating-like pattern with holes/trenches 104 spaced at a constant pitch and having a constant width. The pattern, for example, may be fabricated by a pitch halving or pitch quartering approach. In the case that a via layer is fabricated, some of the holes/trenches 104 may be associated with underlying lower level metallization lines.

It is to be appreciated that the layers and materials described in association with FIG. 1A are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted in FIG. 1A may be fabricated on underlying lower level interconnect layers.

Referring generally to embodiments described herein, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts (e.g., those materials with a dielectric constant less than that of silicon dioxide), and combinations thereof. The interlayer dielectric material may be formed by conventional techniques, such as, for example, chemical vapor deposition (CVD), physical vapor deposition (PVD), or by other deposition methods. The interconnect lines (metal lines and vias structures) formed in the ILD material are also sometimes referred to in the art as traces, wires, lines, metal, or simply interconnect.

Figure 1B:
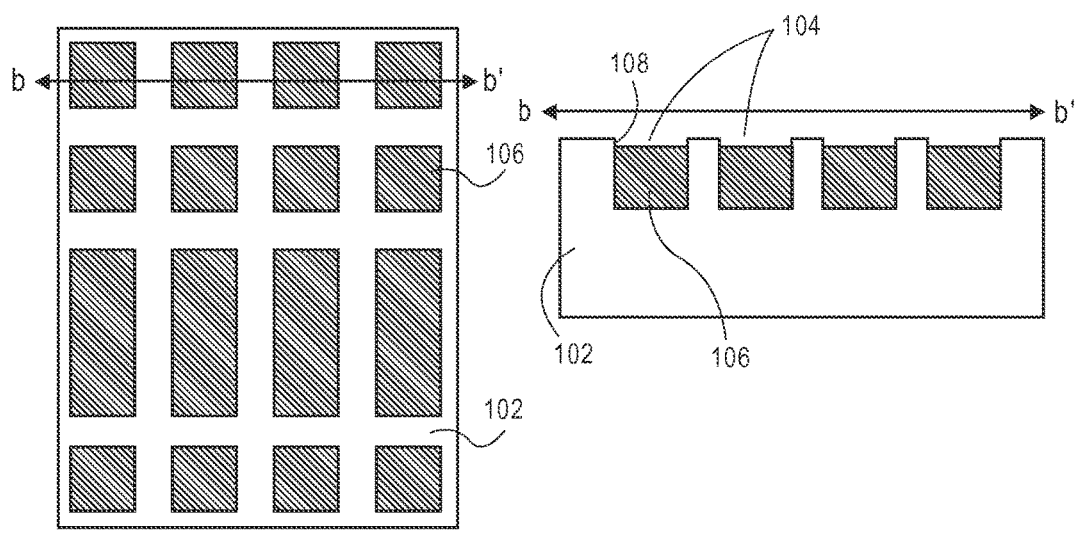

FIG. 1B illustrates a plan view and corresponding cross-sectional view (taken along the b-b' axis) of the structure of FIG. 1A following the filling of holes/trenches 104 with a sacrificial or permanent placeholder material 106. In the case that a permanent placeholder material is used, an ILD material may be used to fill holes/trenches 104. In the case that a sacrificial placeholder material is used, more flexibility in design choice may be afforded. For example, in one embodiment, a material that would not otherwise be suitable for retention in a final structure may be used, such as a structurally weak polymer or a soft photo-resist material. As depicted in the cross-sectional view of FIG. 1B, formation of a slight recess 108 of the sacrificial or permanent placeholder material 106 in the holes/trenches 104 may be included to assist with subsequent processing. In one embodiment, the sacrificial or permanent placeholder material 106 is a spin-on dielectric material.

Figure 1C:
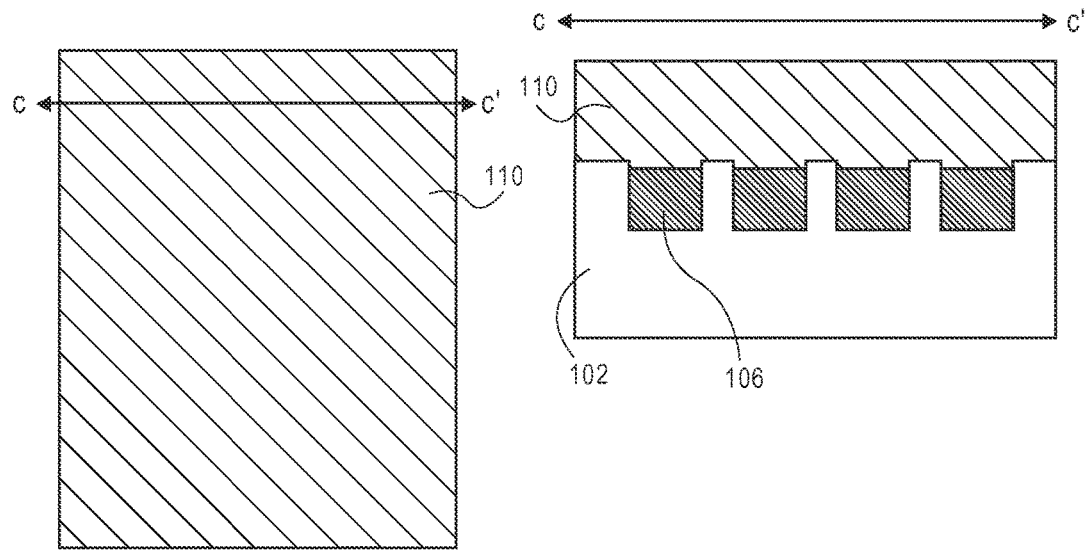

FIG. 1C illustrates a plan view and corresponding cross-sectional view (taken along the c-c' axis) of the structure of FIG. 1B following the formation of a patterning layer 110. In an embodiment the patterning layer 110 is a photo-sensitive material, such as a positive tone photo-resist layer. In another embodiment, the patterning layer 110 is an anti-reflective coating material. In an embodiment, the patterning layer 110 includes a stack of material layers including one or more photo-sensitive material layers and/or one or more anti-reflective coating material layers.

Figure 1D:
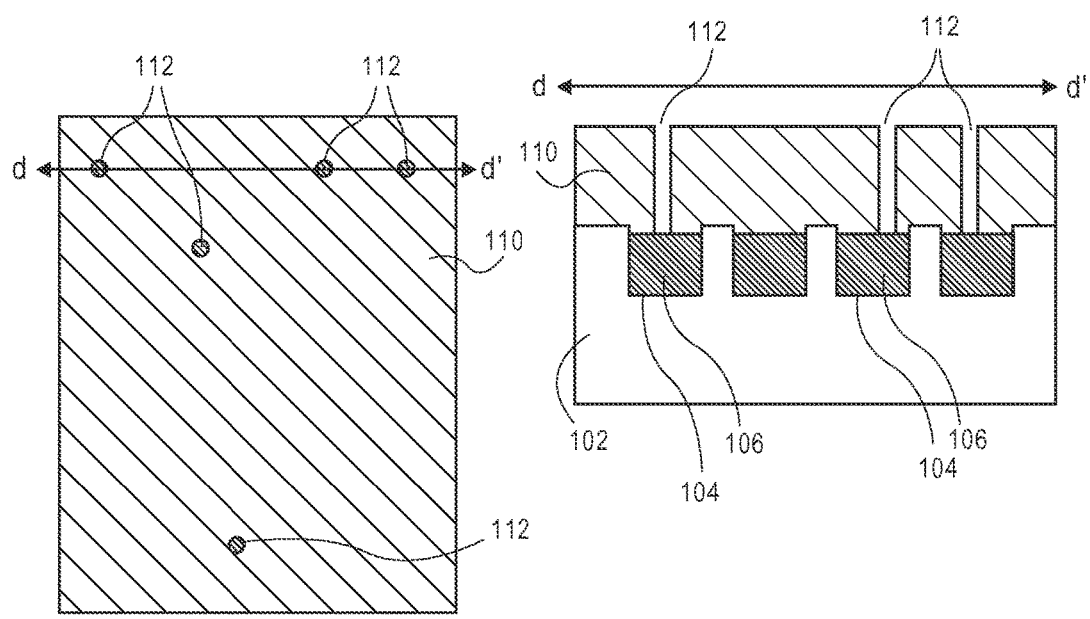

FIG. 1D illustrates a plan view and corresponding cross-sectional view (taken along the d-d' axis) of the structure of FIG. 1C following patterning of the patterning layer 110 to form openings 112 in the patterning layer 110. Referring to FIG. 1D, the openings 112 expose underlying portions of the sacrificial or permanent placeholder material 106. In particular, the openings 112 expose underlying portions of the sacrificial or permanent placeholder material 106 only at the holes/trenches 104 where a via or plug is selected to be formed. In an embodiment, the openings 112 in the patterning layer 110 are substantially smaller than the exposed holes/trenches 104. As described briefly above, the formation of openings 112 that are relatively smaller than exposed holes/trenches 104 provides a markedly increased tolerance for misalignment issues. In an embodiment, the patterning layer 110 is a photo-sensitive material and the openings 112 are formed by a lithographic process, such as a positive tone lithographic process.

Figure 1E:
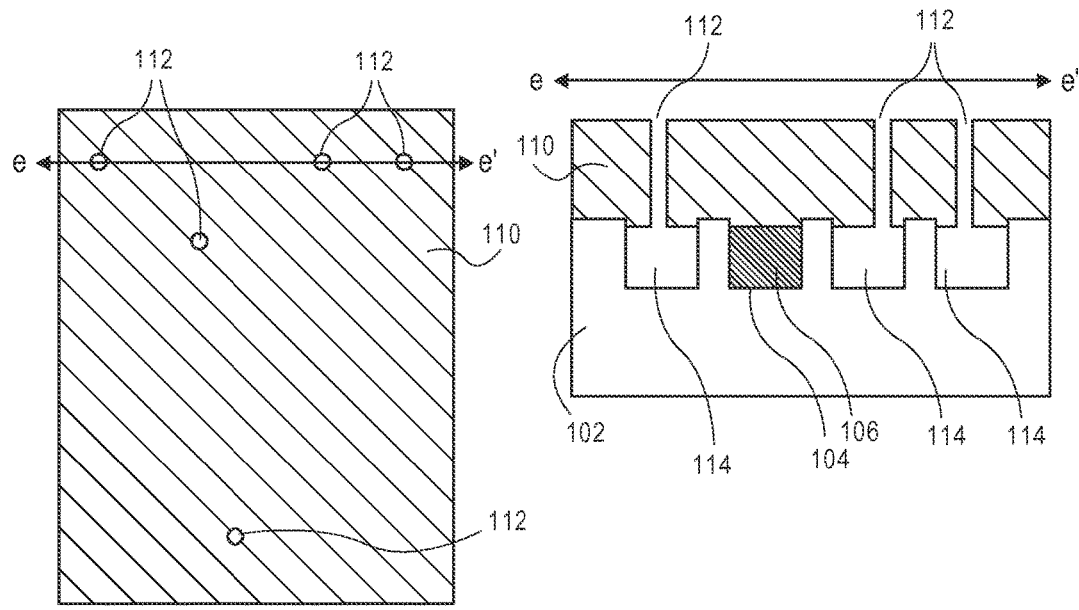

FIG. 1E illustrates a plan view and corresponding cross-sectional view (taken along the e-e' axis) of the structure of FIG. 1D following removal of the sacrificial or permanent placeholder material 106 in locations exposed by the openings 112 to form re-exposed holes/trenches 114. In an embodiment, the sacrificial or permanent placeholder material 106 is removed by an isotropic etching process. In one such embodiment, the isotropic etching process involves application of a wet etchant. The wet etchant accesses and etches the sacrificial or permanent placeholder material 106 through openings 112. The etch process is isotropic in the sense that material that is not exposed by openings 112, but is accessible through openings 112, can be etched to selectively formed re-exposed holes/trenches 114 in desired locations for via or plug formation. In one embodiment, the wet etch process etches the sacrificial or permanent placeholder material 106 without etching, or without substantially etching the patterning layer 110.

In an embodiment, the sacrificial or permanent placeholder material 106 is a spin-on carbon hardmask material and the etch process is a TMAH-based etch process. In another embodiment, the sacrificial or permanent placeholder material 106 is a spin-on bottom anti-reflective coating (BARC) material and the etch process is a TMAH-based etch process. In another embodiment, the sacrificial or permanent placeholder material 106 is a spin-on bottom glass material and the etch process is a wet etch process based on an organic solvent, an acid or a base. In another embodiment, the sacrificial or permanent placeholder material 106 is a spin-on metal oxide material and the etch process is a wet etch process based on commercially available cleans chemicals. In another embodiment, the sacrificial or permanent placeholder material 106 is a CVD carbon material and the etch process is based on an oxygen plasma ash.

Figure 1F:
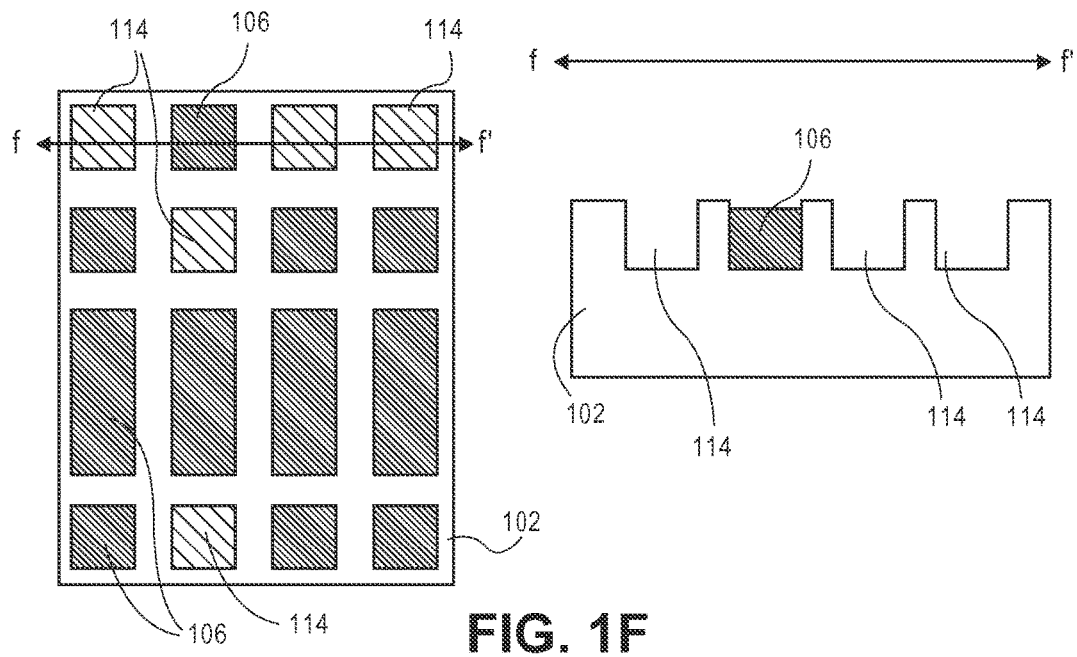

FIG. 1F illustrates a plan view and corresponding cross-sectional view (taken along the f-f axis) of the structure of FIG. 1E following removal of the patterning layer 110. In an embodiment, the patterning layer 110 is a photo-resist layer, and the photo-resist layer is removed by a wet stripping or plasma ashing process. The removal of the patterning layer 110 completely exposes the re-exposed holes/trenches 114.

Figure 1G:
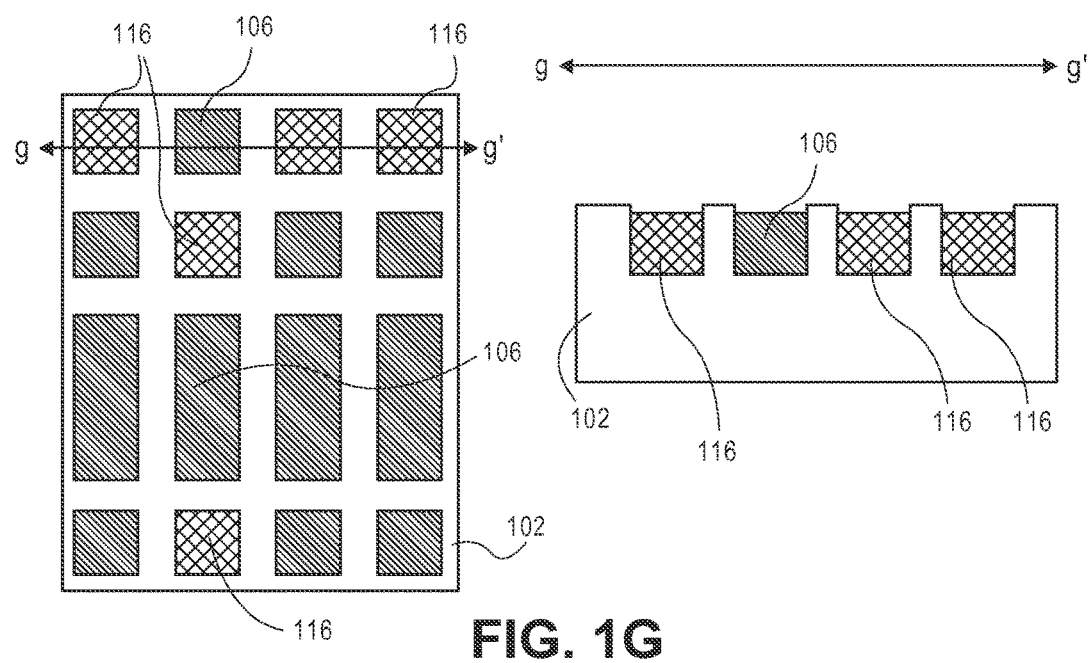

FIG. 1G illustrates a plan view and corresponding cross-sectional view (taken along the g-g' axis) of the structure of FIG. 1F following the filling of the re-exposed holes/trenches 114 with a material layer 116 and subsequent planarization. In an embodiment, the material layer 116 is for forming plugs and is a permanent ILD material. In another embodiment, the material layer 116 is for forming conductive vias and is a metal fill layer. In one such embodiment, the metal fill layer is a single material layer, or is formed from several layers, including conductive liner layers and fill layers. Any suitable deposition process, such as electroplating, chemical vapor deposition or physical vapor deposition, may be used to form such a metal fill layer.

In an embodiment, the metal fill layer is composed of a conductive material such as, but not limited to, Al, Ti, Zr, Hf, V, Ru, Co, Ni, Pd, Pt, Cu, W, Ag, Au or alloys thereof. In the case that the material layer 116 is planarized following deposition, a chemical mechanical polishing process may be used.

In an embodiment, the material layer 116 is a material suitable for forming a conductive via. In one such embodiment, the sacrificial or permanent placeholder material 106 is a permanent placeholder material such as a permanent ILD material. In another such embodiment, the sacrificial or permanent placeholder material 106 is a sacrificial placeholder material that is subsequently removed and replaced with a material such as a permanent ILD material. In another embodiment, the material layer 116 is a material suitable for forming a dielectric plug. In one such embodiment, the sacrificial or permanent placeholder material 106 is a sacrificial placeholder material that is subsequently removed or partially removed to enable metal line formation.

It is to be appreciated that the resulting structure of FIG. 1G may subsequently be used as a foundation for forming subsequent metal line/via and ILD layers. Alternatively, the structure of FIG. 1G may represent the final metal interconnect layer in an integrated circuit. Furthermore, it is to be appreciated that the above examples do not include etch-stop or metal capping layers in the Figures that may otherwise be necessary for patterning. However, for clarity, such layers are not included in the Figures since they do not impact the overall concept.

In another aspect, embodiments are directed to a process flow implementing an isotropic dry etch together with a hole shrink process. In one such embodiment, a patterning scheme provides pinhole patterning in a mask layer following the filling of all via locations with an organic polymer. As an exemplary processing scheme, FIGS. 2A-2C illustrate angled cross-sectional views showing portions of integrated circuit layers representing various operations in a method involving self-aligned isotropic etching of pre-formed via locations, in accordance with an embodiment of the present invention.

Figure 2A:
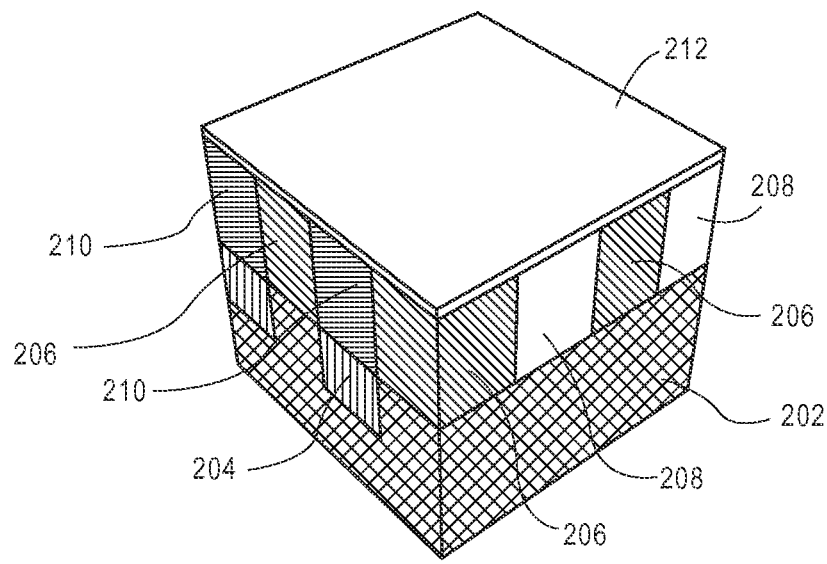
FIGS. 2A-2C illustrate angled cross-sectional views showing portions of integrated circuit layers representing various operations in a method involving self-aligned isotropic etching of pre-formed via locations, in accordance with an embodiment of the present invention, where.

FIG. 2A illustrates a starting structure following filling of all possible via locations with a placeholder material. Referring to FIG. 2A, a metallization layer 202 (such as an ILD layer of a metallization layer) is formed above a substrate (not shown) and includes a plurality of metal lines 204 therein. ILD material(s), which may be two or more distinct ILD materials 206 and 208 surround the locations where vias may possibly be formed. A sacrificial placeholder material 210 occupies the locations where all possible vias may be formed above the metal lines 202. A mask layer 212, such as a thin low temperature oxide mask layer is formed on the underlying structure. It is to be appreciated that sacrificial placeholder material 210 is not present over adjacent features, which may be accomplished by a deposition and planarization or recess process.

Figure 2B:
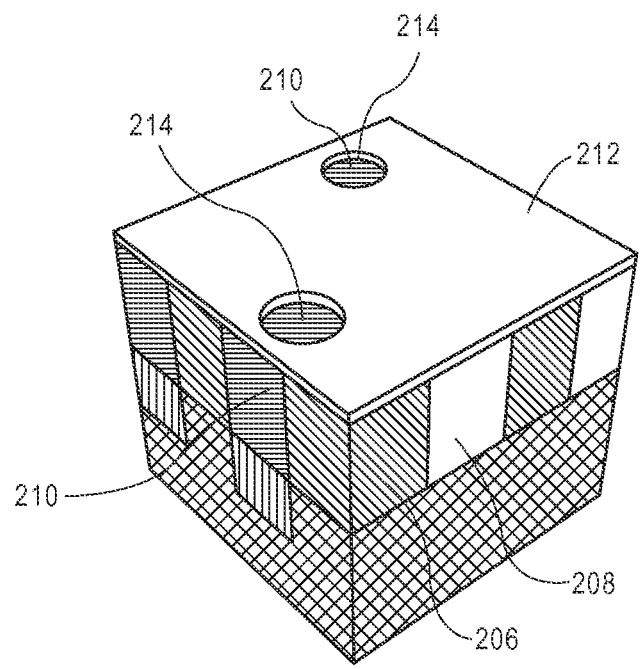

FIG. 2B illustrates the structure of FIG. 2A following patterning of the mask layer 212 to form openings 214 in the mask layer 212. Referring to FIG. 2B, the openings 214 expose underlying portions of the sacrificial placeholder material 210. In particular, the openings 214 expose underlying portions of the sacrificial placeholder material 210 only at the locations where a via is selected to be formed. In an embodiment, the openings 214 in the mask layer 212 are substantially smaller than the exposed sacrificial placeholder material 210. As described briefly above, the formation of openings 214 that are relatively smaller than the exposed sacrificial placeholder material 210 provides a markedly increased tolerance for misalignment issues. The process effectively "shrinks" the via locations to the sizing of "pinholes" with respect to selection and patterning of the actual via locations. In an embodiment, the mask layer 212 is patterned with openings 212 by first forming and patterning a photo-sensitive material on the mask layer 212 by a lithographic process, such as a positive tone lithographic process, and then patterning the mask layer 212 by an etch process.

Figure 2C:
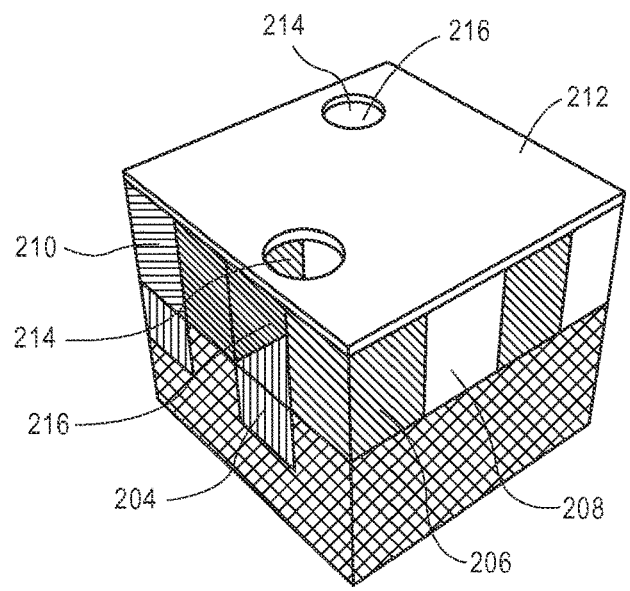

FIG. 2C illustrates the structure of FIG. 2B following removal of the sacrificial placeholder material 210 in locations exposed by the openings 214 to form exposed via locations 216. In an embodiment, the sacrificial placeholder material 210 is removed at the via locations 216 by an isotropic etching process. In one such embodiment, the sacrificial placeholder material 210 is an organic polymer, and the isotropic etching process is an isotropic plasma ash (oxygen plasma) or wet cleans process.

Figure 3:
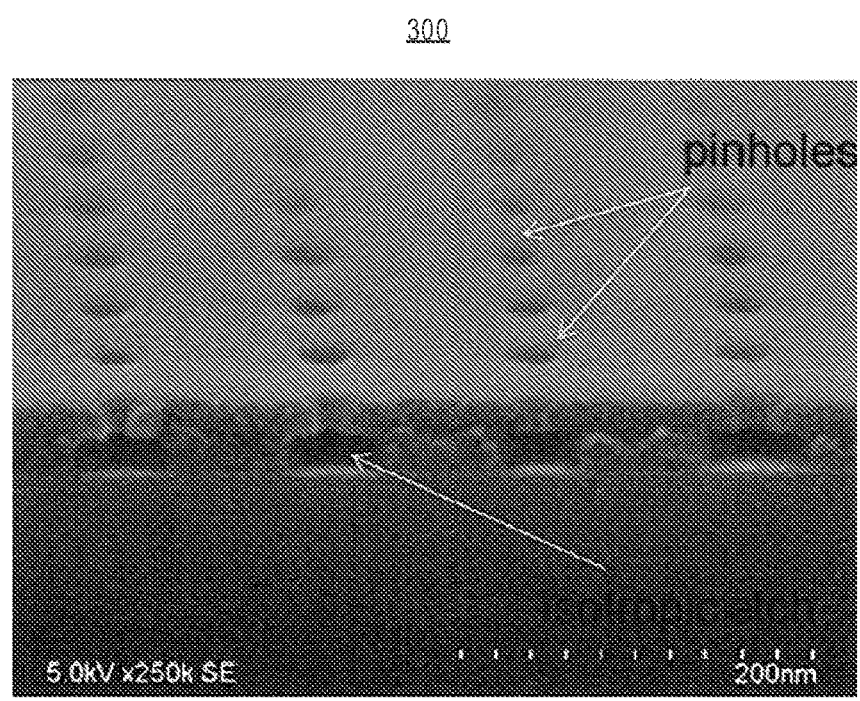
FIG. 3 is a slightly angled cross-sectional view scanning electron microscope (SEM) image of a structure such as the structure of FIG. 2C, in accordance with an embodiment of the present invention.

FIG. 3 is a slightly angled cross-sectional view scanning electron microscope (SEM) image 300 of a structure such as the structure of FIG. 2C, in accordance with an embodiment of the present invention. Referring to SEM image 300, pinholes in a hardmask layer can be viewed, along with cavities or openings where an isotropic etch has been performed.

Referring again to FIG. 2C, it is to be appreciated that subsequent processing may involve removal of the mask layer 212 and filling of holes/trenches 216 with a conductive via material. Also, remaining sacrificial placeholder material 210 not exposed by openings 214 (i.e., not selected as via locations) may be replaced with a permanent ILD material. The resulting structure may subsequently be used as a foundation for forming subsequent metal line/via and ILD layers. Alternatively, the resulting structure may represent the final metal interconnect layer in an integrated circuit.

As illustrated below in a specific implementation of one or more embodiments of the present invention, self-aligned via and metal patterning approaches described herein may include one or more of the following aspects or attributes: (a) a bottom up super-self-aligned via/metal patterning process is enabled; (b) a previous layer metal is used to direct positions of vias on the layer formed above; (c) a process that generates every possible via and metal line end position but maintains only required or desired via and metal line end positions; (d) the position and shape of vias and metal line ends are pre-formed from a previous layer pattern; (e) an intersection of metal below and above naturally forms the fully self-aligned via positions; (f) via and plugs position, size and shape are defined by a pre-existing grating patterning from underlying metal layers; (g) via and plug lithography is required only for selecting one or another and does not affect the position, shape or size of the features (e.g., LWR of the selective via or plug mask is irrelevant); (h) processes described herein may be characterized as an upside down dual-damascene or via/plug first approach; (i) corresponding lithography photoresist design can be simplified since greater tolerance is achieved in the selection of via and plug locations within a layer (this may be referred to as a "bucket" or "photo-bucket" approach, where a photoresist is merely used fill a plurality of generated holes, where only certain holes are subsequently selected to be maintained or deleted); (j) LWR is not critical and faster resists can be used; (k) the size of the features can be fabricated as a single shape and size, and may be applicable for electron beam direct write (EBDW) or extreme ultra-violet (EUV) processes; and (l) via design rules are simplified and all possible vias are allowed in any geometric configuration, where the size of the vias is completely defined by the intersection of the metal above and below.

As an exemplary detailed implementation, FIGS. 4A-4M illustrate portions of integrated circuit layers representing various operations in a method of self-aligned via and metal patterning, in accordance with an embodiment of the present invention. In each illustration at each described operation, plan views are shown on the left-hand side, and corresponding cross-sectional views are shown on the right-hand side. These views will be referred to herein as corresponding cross-sectional views and plan views.

Figure 4A:
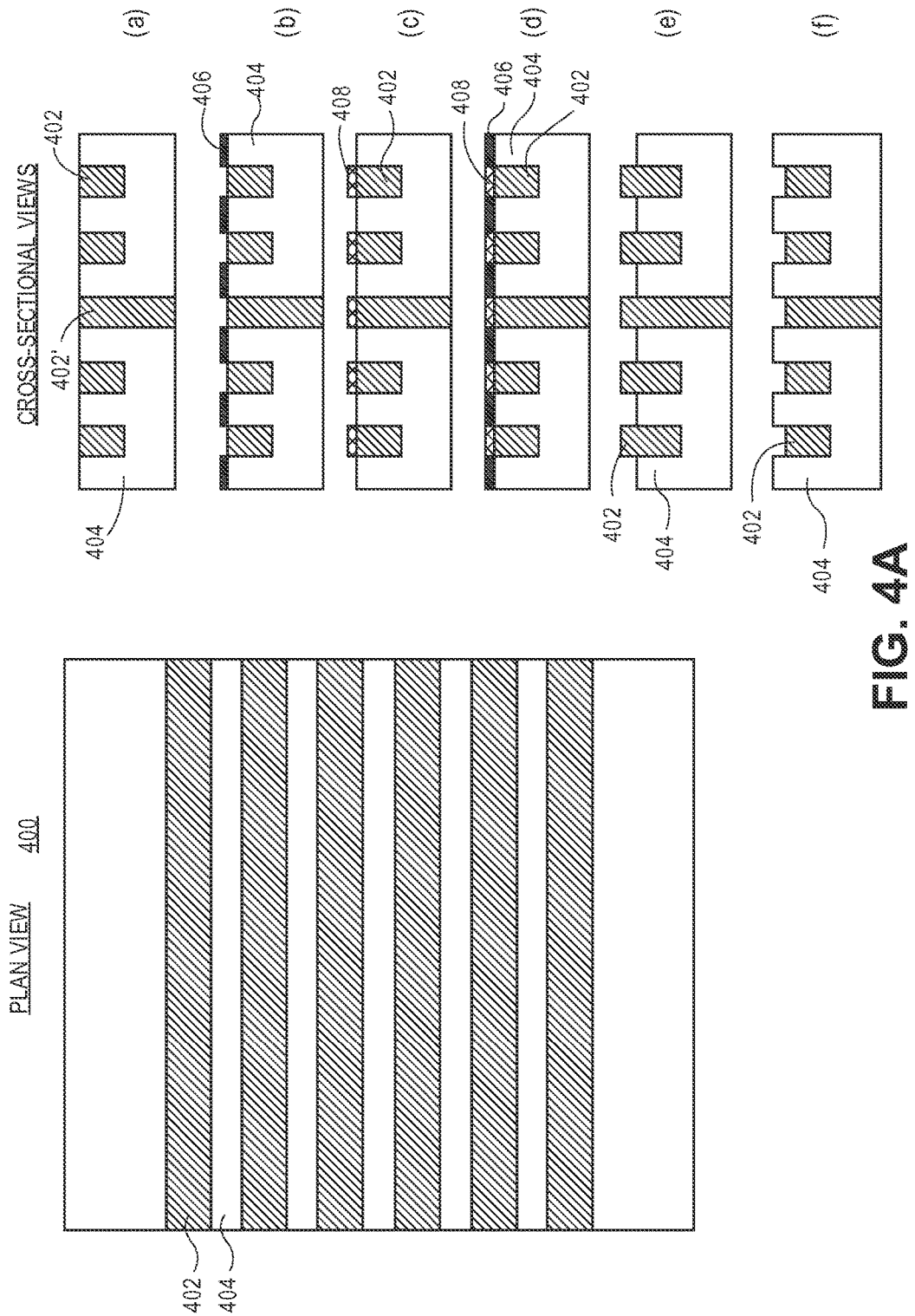

FIG. 4A illustrates a plan view and corresponding cross-sectional views of options for a previous layer metallization structure, in accordance with an embodiment of the present invention. Referring to the plan view and corresponding cross-section view option (a), a starting structure 400 includes a pattern of metal lines 402 and interlayer dielectric (ILD) lines 404. The starting structure 400 may be patterned in a grating-like pattern with metal lines spaced at a constant pitch and having a constant width (e.g., for a directed self-assembly (DSA) embodiment, but not necessarily needed for a directed selective growth embodiment), as is depicted in FIG. 4A. The pattern, for example, may be fabricated by a pitch halving or pitch quartering approach. Some of the lines may be associated with underlying vias, such as line 402' shown as an example in the cross-sectional views.

Referring again to FIG. 4A, alternative options (b)-(f) address situations where an additional film is formed (e.g., deposited, grown, or left as an artifact remaining from a previous patterning process) on a surface of one of, or both of, the metal lines 402 and interlayer dielectric lines 404. In example (b), an additional film 406 is disposed on the interlayer dielectric lines 404. In example, (c), an additional film 408 is disposed on the metal lines 402. In example, (d) an additional film 406 is disposed on the interlayer dielectric lines 404, and an additional film 408 is disposed on the metal lines 402. Furthermore, although the metal lines 402 and the interlayer dielectric lines 404 are depicted as co-planar in (a), in other embodiments, they are not co-planar. For example, in (e), the metal lines 402 protrude above the interlayer dielectric lines 404. In example, (f), the metal lines 402 are recessed below the interlayer dielectric lines 404.

Referring again to examples (b)-(d), an additional layer (e.g., layer 406 or 408) can be used as a hardmask (HM) or protection layer or be used to enable a selective growth and/or self-assembly described below in association with subsequent processing operations. Such additional layers may also be used to protect the ILD lines from further processing. In addition, selectively depositing another material over the metal lines may be beneficial for similar reasons. Referring again to examples (e) and (f), it may also be possible to recess either the ILD lines or the metal lines with any combination of protective/HM materials on either or both surfaces. Overall, there exist numerous options at this stage for preparing ultimately underlying surfaces for a selective or directed self-assembly process.

In an embodiment, as used throughout the present description, interlayer dielectric (ILD) material, such as the material of the interlayer dielectric lines 404, is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), spin-on deposition, or by other deposition methods.

In an embodiment, as is also used throughout the present description, interconnect material, such as the material of metal lines 402, is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. The interconnect lines are also sometimes referred to in the arts as traces, wires, lines, metal, or simply interconnect. As will be described further below, top surfaces of the lower interconnect lines may be used for self-aligned via and plug formation.

In an embodiment, as is also used throughout the present description, hardmask materials, such as layers 406 or 408 if included as a hardmask, are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride), or a metal oxide. Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

It is to be appreciated that the layers and materials described in association with FIG. 4A are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structure depicted in FIG. 4A may be fabricated on underlying lower level interconnect layers.

Figure 4B:
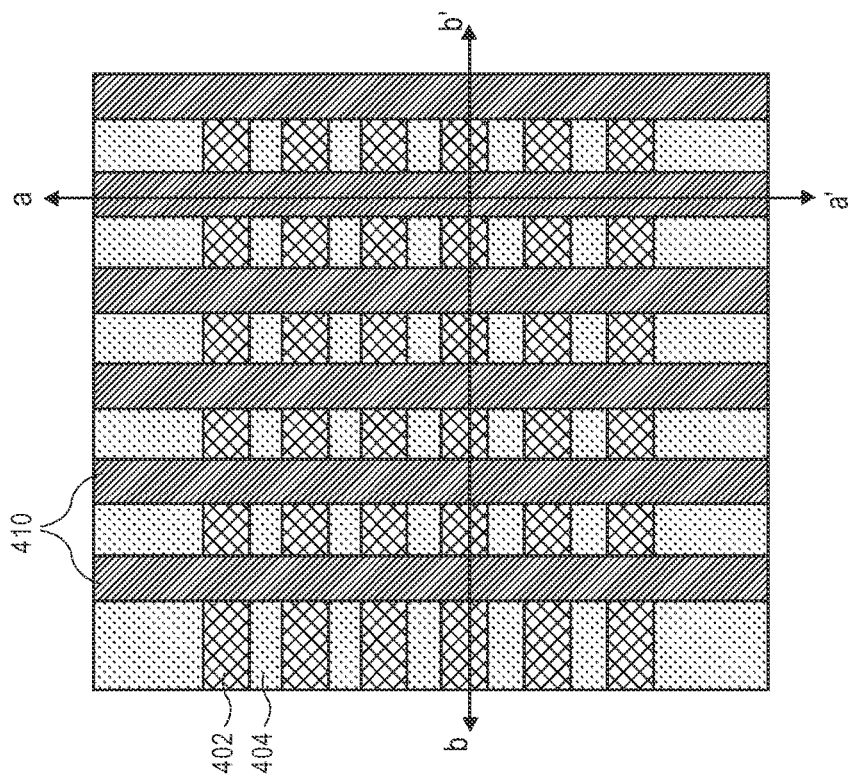
Figure 4B:
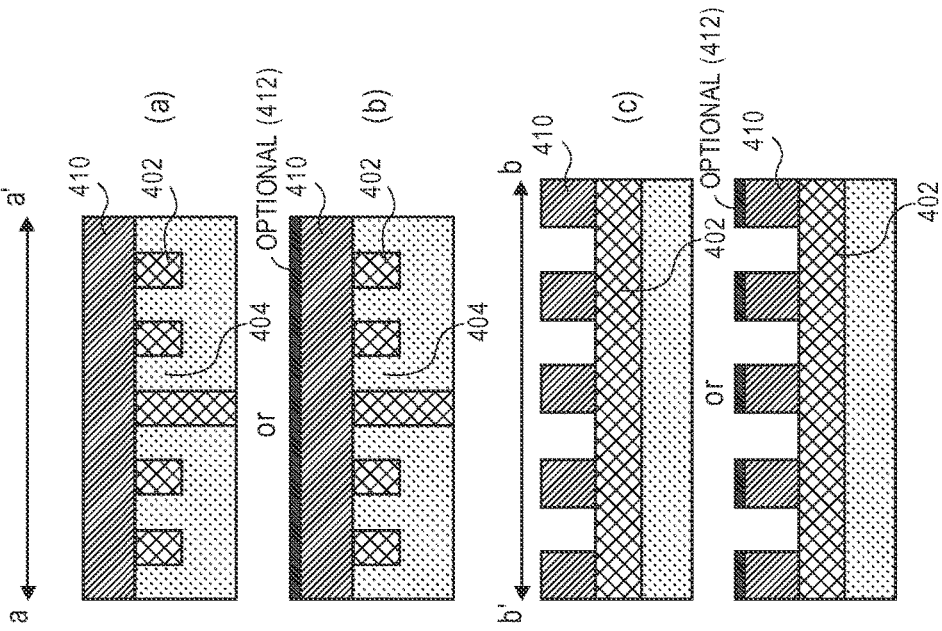

FIG. 4B illustrates a plan view and corresponding cross-sectional views of the structure of FIG. 4A following formation of interlayer dielectric (ILD) lines 410 above the structure of FIG. 4A, in accordance with an embodiment of the present invention. Referring to the plan view and corresponding cross-sectional views (a) and (c) taken along axes a-a' and c-c', respectively, the ILD lines 410 are formed in a grating structure perpendicular to the direction of underlying lines 404. In an embodiment, a blanket film of the material of lines 410 is deposited by chemical vapor deposition or like techniques. In an embodiment, the blanket film is then patterned using lithography and etch processing which may involve, e.g., spacer-based-quadruple-patterning (SBQP) or pitch quartering. It is to be appreciated that the grating pattern of lines 410 can be fabricated by numerous methods, including EUV and/or EBDW lithography, directed self-assembly, etc. As will be described in greater detail below, subsequent metal layer will thus be patterned in the orthogonal direction relative to the previous metal layer since the grating of lines 410 is orthogonal to the direction of the underlying structure. In one embodiment, a single 193 nm lithography mask is used with alignment/registration to the previous metal layer 402 (e.g., grating of lines 410 aligns to the previous layer 'plug' pattern in X and to the previous metal grating in Y). Referring to cross-sectional structures (b) and (d), a hardmask 412 may be formed on, or retained following pattering of, dielectric lines 110. The hardmask 412 can be used to protect lines 410 during subsequent patterning steps. As described in greater detail below, the formation of lines 410 in a grating pattern exposes regions of the previous metal lines 402 and previous ILD lines 404 (or corresponding hardmask layers on 402/404). The exposed regions correspond to all possible future via locations where metal is exposed. In one embodiment, the previous layer metal layer (e.g., lines 402) is protected, labeled, brushed, etc. at this point in the process flow.

Figure 4C:
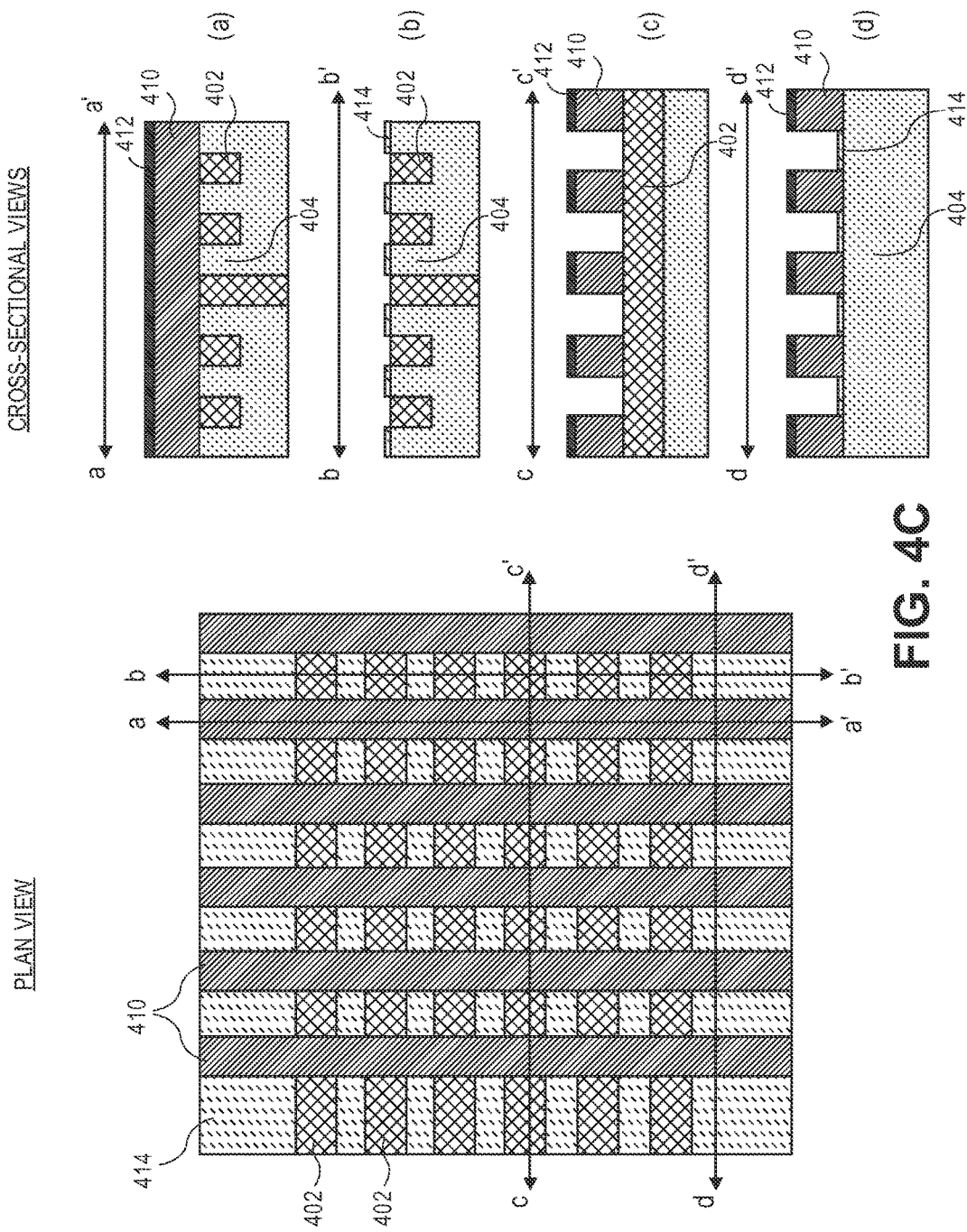

FIG. 4C illustrates a plan view and corresponding cross-sectional views of the structure of FIG. 4B following selective differentiation all of the potential via locations from all of the plug locations, in accordance with an embodiment of the present invention. Referring to the plan view and corresponding cross-sectional views (a)-(d) taken along axes, a-a', b-b', c-c' and d-d', respectively, following formation of ILD lines 410, a surface modification layer 414 is formed on exposed regions of the underlying ILD lines 404. In an embodiment, surface modification layer 414 is a dielectric layer. In an embodiment, surface modification layer 414 is formed by a selective bottom-up growth approach. In one such embodiment, the bottom-up growth approach involves a directed self-assembly (DSA) brush coat that has one polymer component which assembles preferentially on the underlying ILD lines 404 or, alternatively, on the metal lines 402 (or on a sacrificial layer deposited or grown on the underlying metal or ILD material).

Figure 4D:
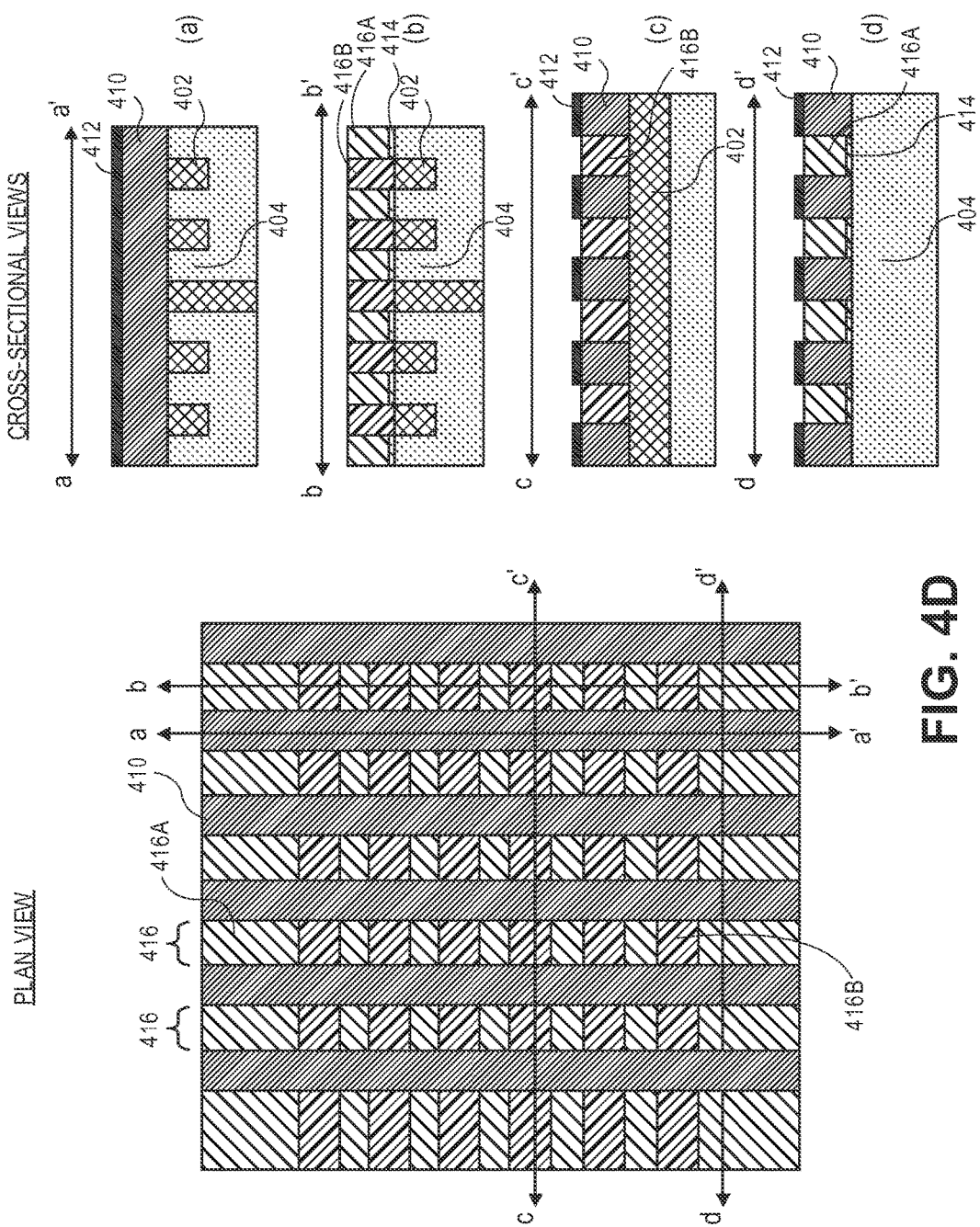

FIG. 4D illustrates a plan view and corresponding cross-sectional views of the structure of FIG. 4C following differential polymer addition to the exposed portions of underlying metal and ILD lines of FIG. 4C, in accordance with an embodiment of the present invention. Referring to the plan view and corresponding cross-sectional views (a)-(d) taken along axes, a-a', b-b', c-c' and d-d', respectively, directed self-assembly (DSA) or selective growth on exposed portions of the underlying metal/ILD 402/404 grating is used to form intervening lines 416 with alternating polymers or alternating polymer components in between the ILD lines 410. For example, as shown, polymer 416A (or polymer component 416A) is formed on or above the exposed portions of interlayer dielectric (ILD) lines 404 of FIG. 4C, while polymer 416B (or polymer component 416B) is formed on or above the exposed portions of the metal lines 402 of FIG. 4C. Although polymer 416A is formed on or above the surface modification layer 414 described in association with FIG. 4C (see cross-sectional views (b) and (d)

of FIG. 4D), it is to be appreciated that, in other embodiments, the surface modification layer 414 can be omitted and the alternating polymers or alternating polymer components can instead be formed directly in the structure described in association with FIG. 4B.

Referring again to FIG. 4D, in an embodiment, once the surface of the underlying structure (e.g., structure 400 of FIG. 4A) has been prepared (e.g., such as the structure of FIG. 4B or the structure of FIG. 4C) or is used directly, an approximately 50-50 diblock copolymer, such as polystyrene-polymethyl methacrylate (PS-PMMA), is coated on the substrate and annealed to drive self-assembly, leading to the polymer 416A/polymer 416B layer 416 of FIG. 4D. In one such embodiment, with appropriate surface energy conditions, the block copolymers segregate based on the underlying material exposed between ILD lines 410. For example, in a specific embodiment, polystyrene aligns selectively to the exposed portions of underlying metal lines 402 (or corresponding metal line cap or hardmask material). Meanwhile, the polymethyl methacrylate aligns selectively to the exposed portions of ILD lines 404 (or corresponding metal line cap or hardmask material).

Thus, in an embodiment, the underlying metal and ILD grid, as exposed between ILD lines 410 is recreated in the block co-polymer (BCP, i.e., polymer 416A/polymer 416B). This can particularly be so if the BCP pitch is commensurate with the underlying grating pitch. The polymer grid (polymer 416A/polymer 416B) is, in one embodiment, robust against certain small deviations from a perfect grid. For example, if small plugs effectively place an oxide or like material where a perfect grid would have metal, a perfect polymer 416A/polymer 416B grid can still be achieved. However, since the ILD lines grating is, in one embodiment, an idealized grating structure, with no metal disruptions of the ILD backbone, it may be necessary to render the ILD surface neutral since both types of polymer (416A and 416B) will, in such an instance, be exposed to ILD like material while only one type is exposed to metal.

In an embodiment, the thickness of the coated polymer (polymer 416A/polymer 416B) is approximately the same as, or slightly thicker than, the ultimate thickness of an ILD ultimately formed in its place. In an embodiment, as described in greater detail below, the polymer grid is formed not as an etch resist, but rather as scaffolding for ultimately growing a permanent ILD layer there around. As such, the thickness of the polymer 416 (polymer 416A/polymer 416B) can be important since it may be used to define the ultimate thickness of a subsequently formed permanent ILD layer. That is, in one embodiment, the polymer grating shown in FIG. 4D is eventually replaced with an ILD grating of roughly the same thickness.

In an embodiment, as mentioned above, the grid of polymer 416A/polymer 416B of FIG. 4D is a block copolymer. In one such embodiment, the block copolymer molecule is a polymeric molecule formed of a chain of covalently bonded monomers. In a block copolymer, there are at least two different types of monomers, and these different types of monomers are primarily included within different blocks or contiguous sequences of monomers. The illustrated block copolymer molecule includes a block of polymer 416A and a block of polymer 416B. In an embodiment, the block of polymer 416A includes predominantly a chain of covalently linked monomer A (e.g., A-A-A-A-A . . . ), whereas the block of polymer 416B includes predominantly a chain of covalently linked monomer B (e.g., B-B-B-B-B . . . ). The monomers A and B may represent any of the different types of monomers used in block copolymers known in the arts. By way of example, the monomer A may represent monomers to form polystyrene, and the monomer B may represent monomers to form poly(methyl methacrylate) (PMMA), although the scope of the invention is not so limited. In other embodiments, there may be more than two blocks. Moreover, in other embodiments, each of the blocks may include different types of monomers (e.g., each block may itself be a copolymer). In one embodiment, the block of polymer 416A and the block of polymer 416B are covalently bonded together. The block of polymer 416A and the block of polymer 416B may be of approximately equal length, or one block may be significantly longer than the other.

Typically, the blocks of block copolymers (e.g., the block of polymer 416A and the block of polymer 416B) may each have different chemical properties. As one example, one of the blocks may be relatively more hydrophobic (e.g., water repelling) and the other may be relatively more hydrophilic (water attracting). At least conceptually, one of the blocks may be relatively more similar to oil and the other block may be relatively more similar to water. Such differences in chemical properties between the different blocks of polymers, whether a hydrophilic-hydrophobic difference or otherwise, may cause the block copolymer molecules to self-assemble. For example, the self-assembly may be based on microphase separation of the polymer blocks. Conceptually, this may be similar to the phase separation of oil and water which are generally immiscible. Similarly, differences in hydrophilicity between the polymer blocks (e.g., one block is relatively hydrophobic and the other block is relatively hydrophilic), may cause a roughly analogous microphase separation where the different polymer blocks try to "separate" from each other due to chemical dislike for the other.

However, in an embodiment, since the polymer blocks are covalently bonded to one another, they cannot completely separate on a macroscopic scale. Rather, polymer blocks of a given type may tend to segregate or conglomerate with polymer blocks of the same type of other molecules in extremely small (e.g., nano-sized) regions or phases. The particular size and shape of the regions or microphases generally depends at least in part upon the relative lengths of the polymer blocks. In an embodiment, by way of example (as shown in FIG. 4D), in two block copolymers, if the blocks are approximately the same length, a grid like pattern of alternating polymer 416A lines and polymer 416B lines is generated. In another embodiment (not shown), in two block copolymers, if one of the blocks is longer than the other, but not too much longer than the other, columnar structures may formed. In the columnar structures, the block copolymer molecules may align with their shorter polymer blocks microphase separated into the interior of the columns and their longer polymer blocks extending away from the columns and surrounding the columns. For example, if the block of polymer 416A were longer than the block of polymer 416B, but not too much longer, columnar structures may formed in which many block copolymer molecules align with their shorter blocks of polymer 416B forming columnar structures surrounded by a phase having the longer blocks of polymer 416A. When this occurs in an area of sufficient size, a two-dimensional array of generally hexagonally-packed columnar structures may be formed.

In an embodiment, the polymer 416A/polymer 416B grating is first applied as an unassembled block copolymer layer portion that includes a block copolymer material applied, e.g., by brush or other coating process. The unassembled aspect refers to scenarios where, at the time of deposition, the block copolymer has not yet substantially phase separated and/or self-assembled to form nanostructures. In this unassembled form, the block polymer molecules are relatively highly randomized, with the different polymer blocks relatively highly randomly oriented and located, which is in contrast to the assembled block copolymer layer portion discussed in association with the resulting structure of FIG. 4D. The unassembled block copolymer layer portion may be applied in a variety of different ways. By way of example, the block copolymer may be dissolved in a solvent and then spin coated over the surface. Alternatively, the unassembled block copolymer may be spray coated, dip coated, immersion coated, or otherwise coated or applied over the surface. Other ways of applying block copolymers, as well as other ways known in the arts for applying similar organic coatings, may potentially be used. Then, the unassembled layer may form an assembled block copolymer layer portion, e.g., by microphase separation and/or self-assembly of the unassembled block copolymer layer portion. The microphase separation and/or self-assembly occurs through rearrangement and/or repositioning of the block copolymer molecules, and in particular to rearrangement and/or repositioning of the different polymer blocks of the block copolymer molecules.

In one such embodiment, an annealing treatment may be applied to the unassembled block copolymer in order to initiate, accelerate, increase the quality of, or otherwise promote microphase separation and/or self-assembly. In some embodiments, the annealing treatment may include a treatment that is operable to increase a temperature of the block copolymer. One example of such a treatment is baking the layer, heating the layer in an oven or under a thermal lamp, applying infrared radiation to the layer, or otherwise applying heat to or increasing the temperature of the layer. The desired temperature increase will generally be sufficient to significantly accelerate the rate of microphase separation and/or self-assembly of the block polymer without damaging the block copolymer or any other important materials or structures of the integrated circuit substrate. Commonly, the heating may range between about 50° C. to about 300° C., or between about 75° C. to about 250° C., but not exceeding thermal degradation limits of the block copolymer or integrated circuit substrate. The heating or annealing may help to provide energy to the block copolymer molecules to make them more mobile/flexible in order to increase the rate of the microphase separation and/or improve the quality of the microphase separation. Such microphase separation or rearrangement/repositioning of the block copolymer molecules may lead to self-assembly to form extremely small (e.g., nano-scale) structures. The self-assembly may occur under the influence of surface energy, molecular affinities, and other surface-related and chemical-related forces.

In any case, in some embodiments, self-assembly of block copolymers, whether based on hydrophobic-hydrophilic differences or otherwise, may be used to form extremely small periodic structures (e.g., precisely spaced nano-scale structures or lines). In some embodiments, they may be used to form nano-scale lines or other nano-scale structures that can ultimately be used to form via and openings. In some embodiments, directed self-assembly of block copolymers may be used to form vias that are self-aligned with interconnects, as described in greater detail below.

Referring again to FIG. 4D, in an embodiment, for a DSA process, in addition to direction from the underlying ILD/metal 404/402 surfaces the growth process can be affected by the sidewalls of the material of ILD lines 410. As such, in one embodiment, DSA is controlled through graphoepitaxy (from the sidewalls of lines 410) and chemoepitaxy (from the underlying exposed surface characteristics). Constraining the DSA process both physically and chemically can significantly aid the process from a defectivity standpoint. The resulting polymers 416A/416B have fewer degrees of freedom and are fully constrained in all directions through chemical (e.g., underlying ILD or metal lines, or surface modifications made thereto by, for example, a brush approach) and physical (e.g., from the trenches formed between the ILD lines 410).

Figure 4E:
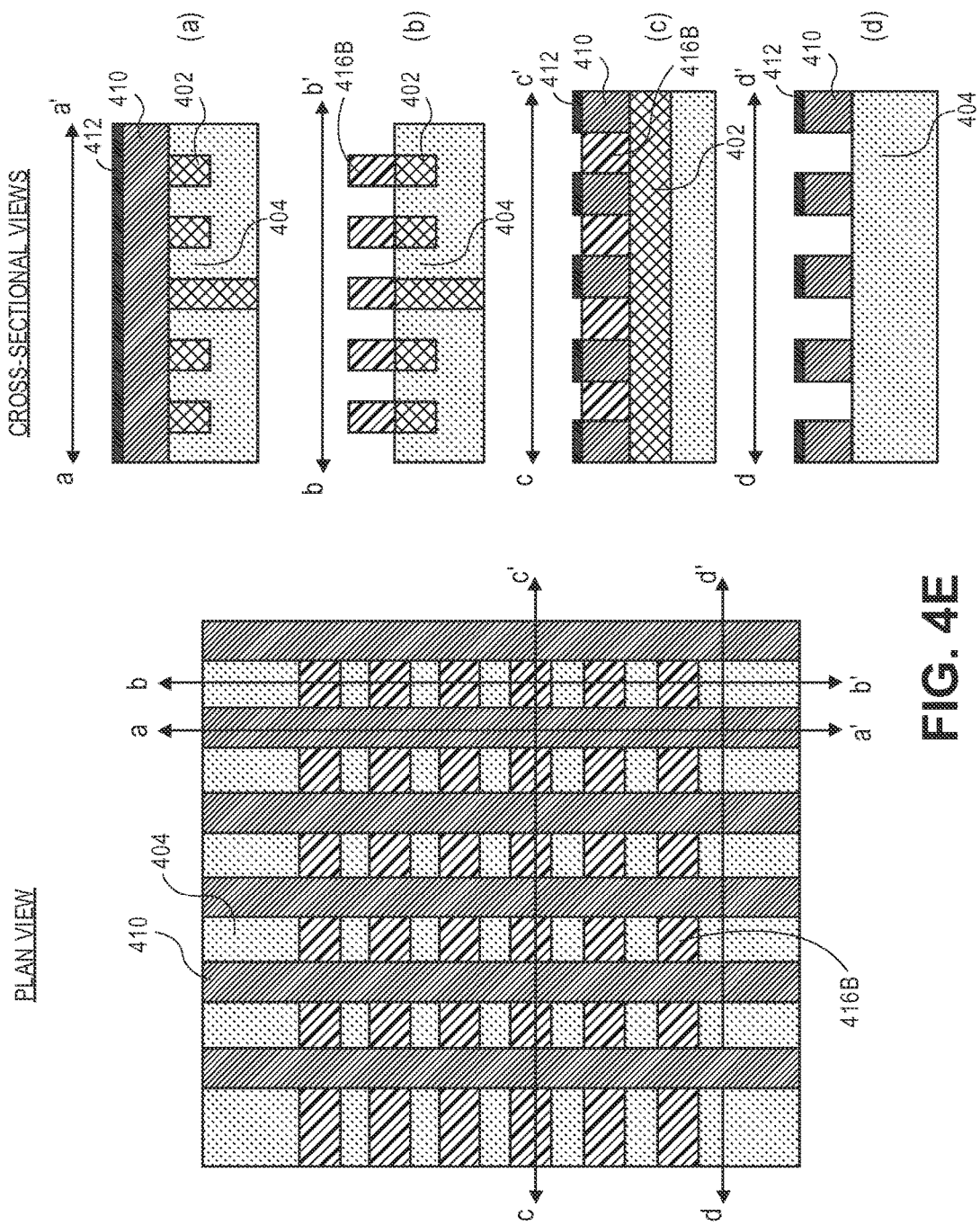

FIG. 4E illustrates a plan view and corresponding cross-sectional views of the structure of FIG. 4D following removal of one species of polymer, in accordance with an embodiment of the present invention. Referring to the plan view and corresponding cross-sectional views (a)-(d) taken along axes, a-a', b-b', c-c' and d-d', respectively, polymer or polymer portion 416A is removed to re-expose the ILD lines 404 (or hardmask or cap layers formed on the ILD lines 404), while polymer or polymer portion 416B is retained above the metal lines 402. In an embodiment, a deep ultra-violet (DUV) flood expose followed by a wet etch or a selective dry etch is used to selectively remove polymer 416A. It is to be appreciated that, instead of first removal of the polymer from the ILD lines 404 (as depicted), removal from the metal lines 402 may instead be first performed. Alternatively, a dielectric film is selectively grown over the region, and a mixed scaffolding is not used.

Figure 4F:
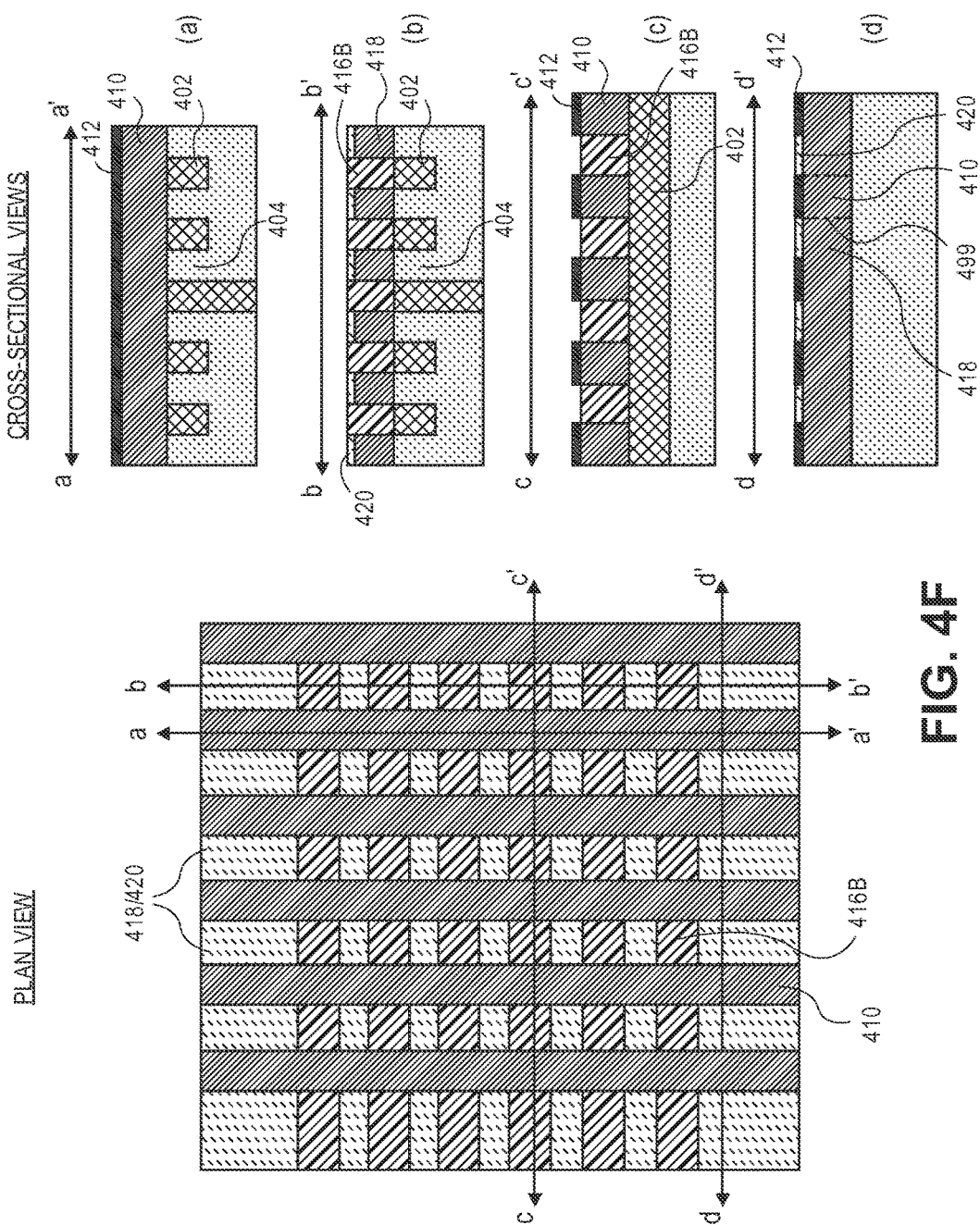

FIG. 4F illustrates a plan view and corresponding cross-sectional views of the structure of FIG. 4E following formation of an ILD material in the locations opened upon removal of the one species of polymer, in accordance with an embodiment of the present invention. Referring to the plan view and corresponding cross-sectional views (a)-(d) taken along axes, a-a', b-b', c-c' and d-d', respectively, the exposed regions of underlying ILD lines 404 are filled with a permanent interlayer dielectric (ILD) layer 418. As such, the open spaces between all possible via positions are filled with an ILD layer 418 includes a hardmask layer 420 disposed thereon, as depicted in the plan view and in the cross-sectional views (b) and (d) of FIG. 4F. It is to be appreciated that the material of ILD layer 418 need not be the same material as ILD lines 410. In an embodiment, the ILD layer 418 is formed by a deposition and polish process. In the case where ILD layer 418 is formed with an accompanying hardmask layer 420, a special ILD fill material may be used (e.g., polymer encapsulated nanoparticles of ILD that fills holes/trenches). In such a case, a polish operation may not be necessary.

Referring again to FIG. 4F, in an embodiment, the resulting structure includes a uniform ILD structure (ILD lines 410+ILD layer 418), and the locations of all possible plugs are covered in hardmask 420 and all possible vias are in areas of polymer 416B. In one such embodiment, ILD lines 410 and ILD layer 418 are composed of a same material. In another such embodiment, ILD lines 410 and ILD layer 418 are composed of different ILD materials. In either case, in a specific embodiment, a distinction such as a seam between the materials of ILD lines 410 and ILD layer 418 may be observed in the final structure. Exemplary seams 499 are shown in FIG. 4F for illustrative purposes.

Figure 4G:
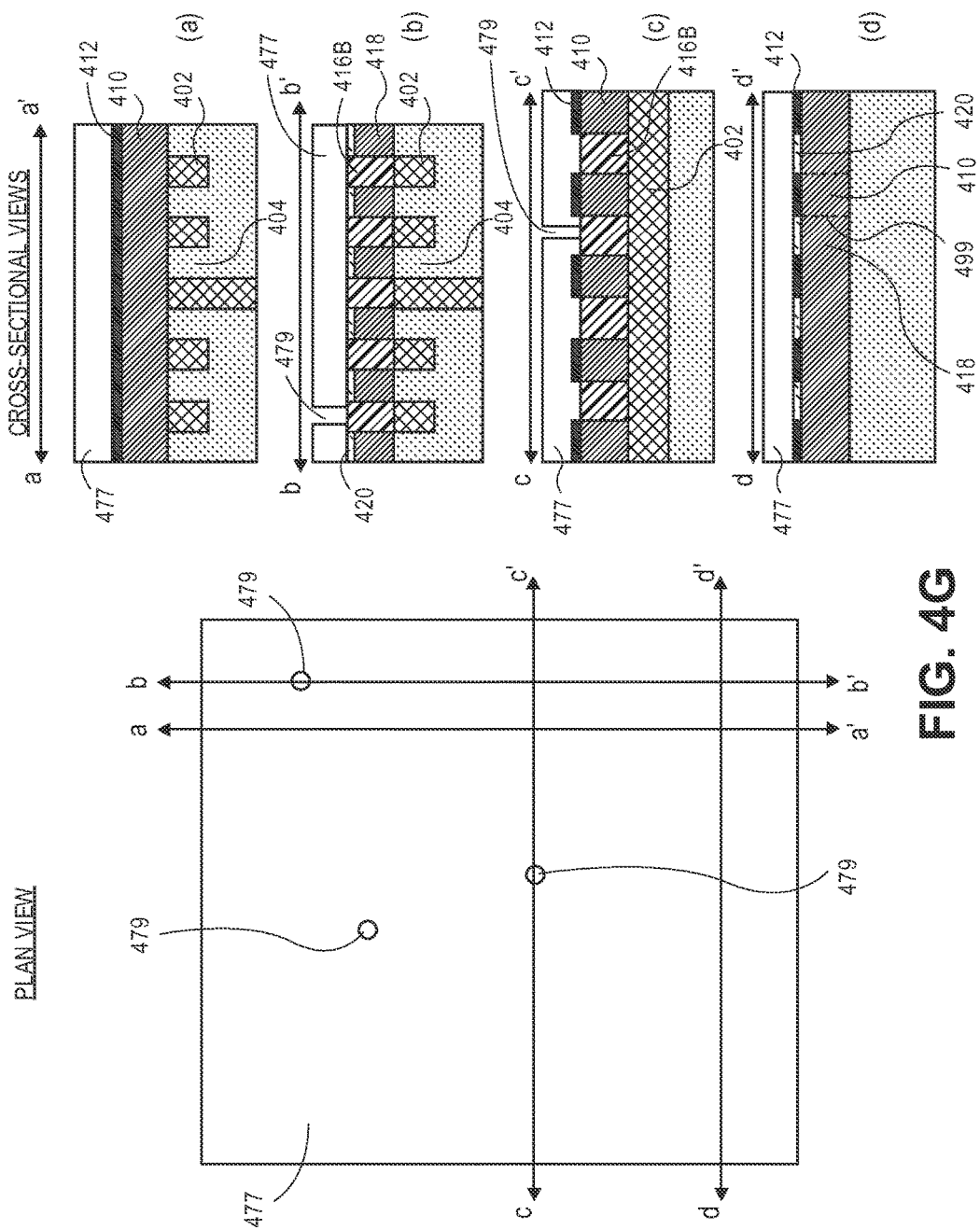

FIG. 4G illustrates a plan view and corresponding cross-sectional views of the structure of FIG. 4F following formation of a mask layer 477 with openings 479 patterned therein. Such a mask layer 477 and openings 479 may be fabricated according to either of the processes described above in association with FIGS. 1A-1G or 2A-2C. In one such embodiment, the process enables removal of polymer 416B in select locations (i.e., in selected via locations). In another embodiment, just prior to forming the mask layer 477 with openings 479, the polymer 416B is replaced with a sacrificial or permanent placeholder material as described in association with FIGS. 1A-1G or 2A-2C.

Figure 4H:
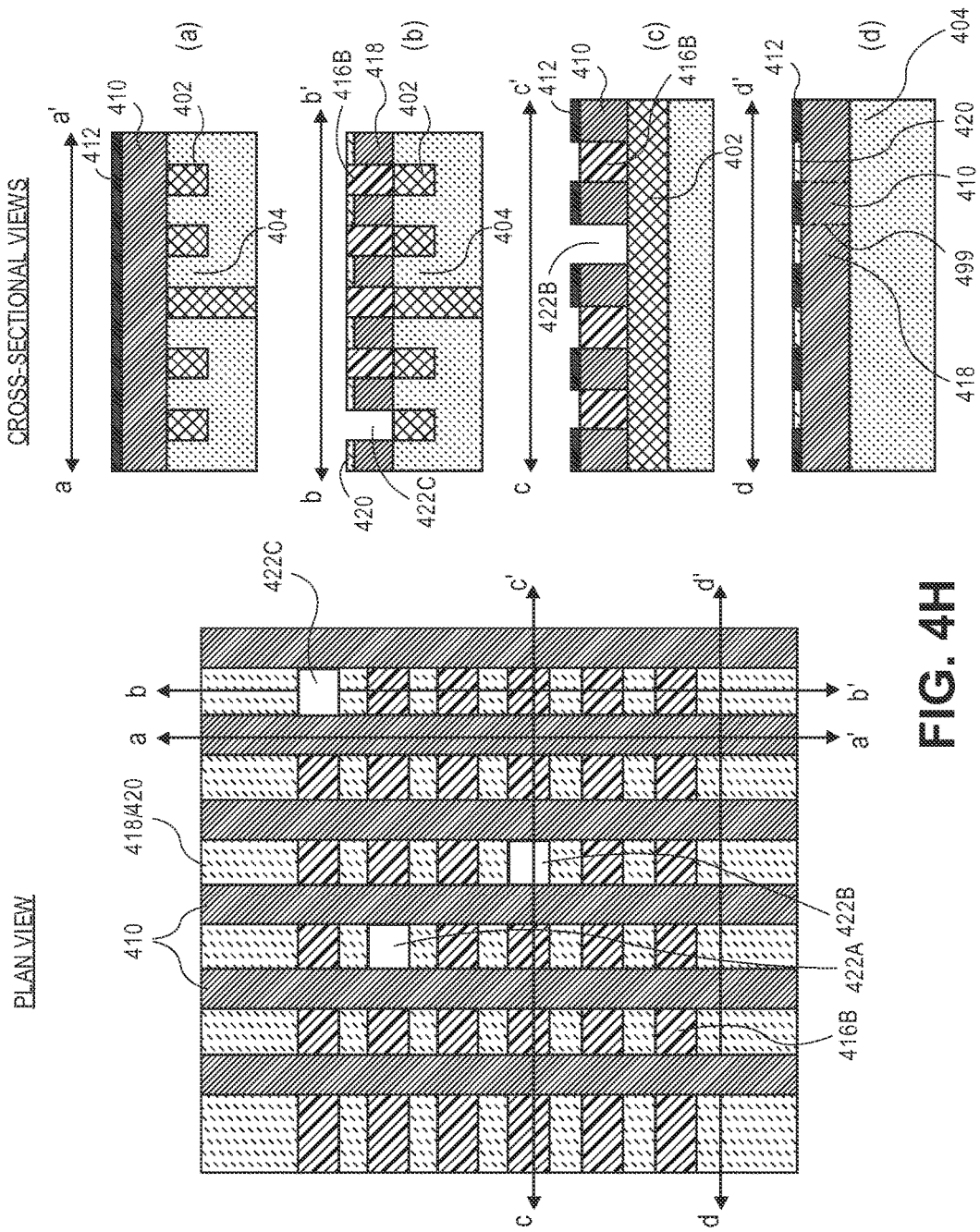

FIG. 4H illustrates a plan view and corresponding cross-sectional views of the structure of FIG. 4G following opening of the selected via locations and mask removal (removal of mask 477), in accordance with an embodiment of the present invention. Referring to the plan view and corresponding cross-sectional views (a)-(d) taken along axes, a-a', b-b', c-c' and d-d', respectively, via locations 422A, 422B and 422C are now opened.

FIG. 4I illustrates a plan view and corresponding cross-sectional views of the structure of FIG. 4H following via formation, in accordance with an embodiment of the present invention. Referring to the plan view and corresponding cross-sectional views (a)-(d) taken along axes, a-a', b-b', c-c' and d-d', respectively, via locations 422A, 422B and 422C are filled with metal to form vias 424A, 424B and 424C, respectively. In an embodiment, via locations 422A, 422B and 422C are filled with excess metal, and a subsequent polish operation is performed. In another embodiment, however, via locations 422A, 422B and 422C are filled without metal overfilling and the polishing operation is omitted. It is to be appreciated that the via fill illustrated in FIG. 4I may be skipped in a reverse tone via selection approach.

Figure 4J:
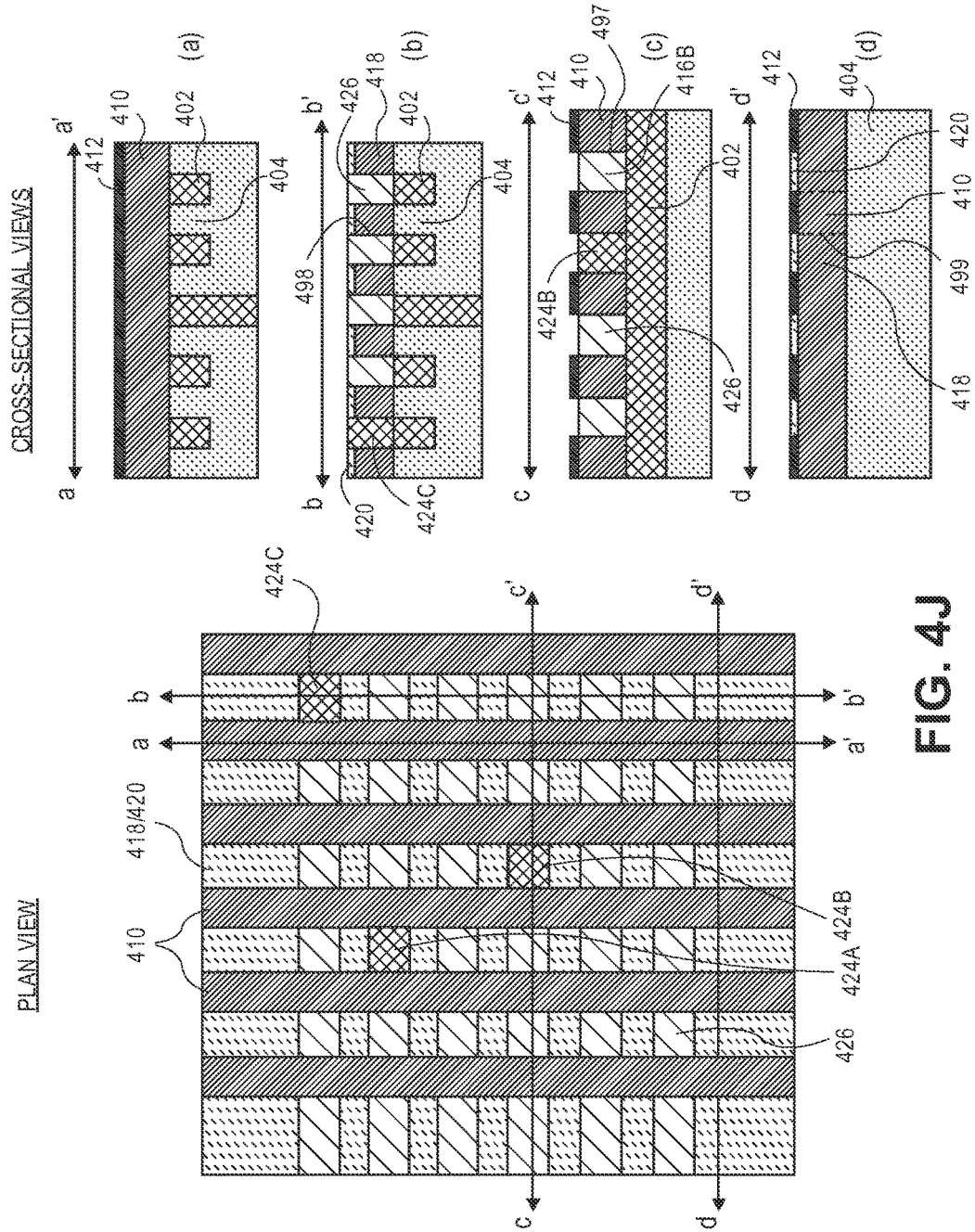

FIG. 4J illustrates a plan view and corresponding cross-sectional views of the structure of FIG. 4I following removal of the second species of polymer and replacement with an ILD material, in accordance with an embodiment of the present invention. Referring to the plan view and corresponding cross-sectional views (a)-(d) taken along axes, a-a', b-b', c-c' and d-d', respectively, remaining polymer or polymer portion 416B (e.g., where vias locations have not been selected) is removed to re-expose the metal lines 402. Subsequently, an ILD layer 426 is formed in the locations where the remaining polymer or polymer portion 416B was removed, as depicted in FIG. 4J.

Referring again to FIG. 4J, in an embodiment, the resulting structure includes a uniform ILD structure (ILD lines 410+ILD layer 418+ILD layer 426), and the locations of all possible plugs are covered in hardmask 420. In one such embodiment, ILD lines 410, ILD layer 418 and ILD layer 426 are composed of a same material. In another such embodiment, two of ILD lines 410, ILD layer 418 and ILD layer 426 are composed of a same material and the third is composed of a different ILD material. In yet another such embodiment, all of ILD lines 410, ILD layer 418 and ILD layer 426 are composed of a different ILD material with respect to one another. In any case, in a specific embodiment, a distinction such as a seam between the materials of ILD lines 410 and ILD layer 426 may be observed in the final structure. Exemplary seams 497 are shown in FIG. 4J for illustrative purposes. Likewise, a distinction such as a seam between the materials of ILD layer 418 and ILD layer 426 may be observed in the final structure. Exemplary seams 498 are shown in FIG. 4J for illustrative purposes.

Figure 4K:
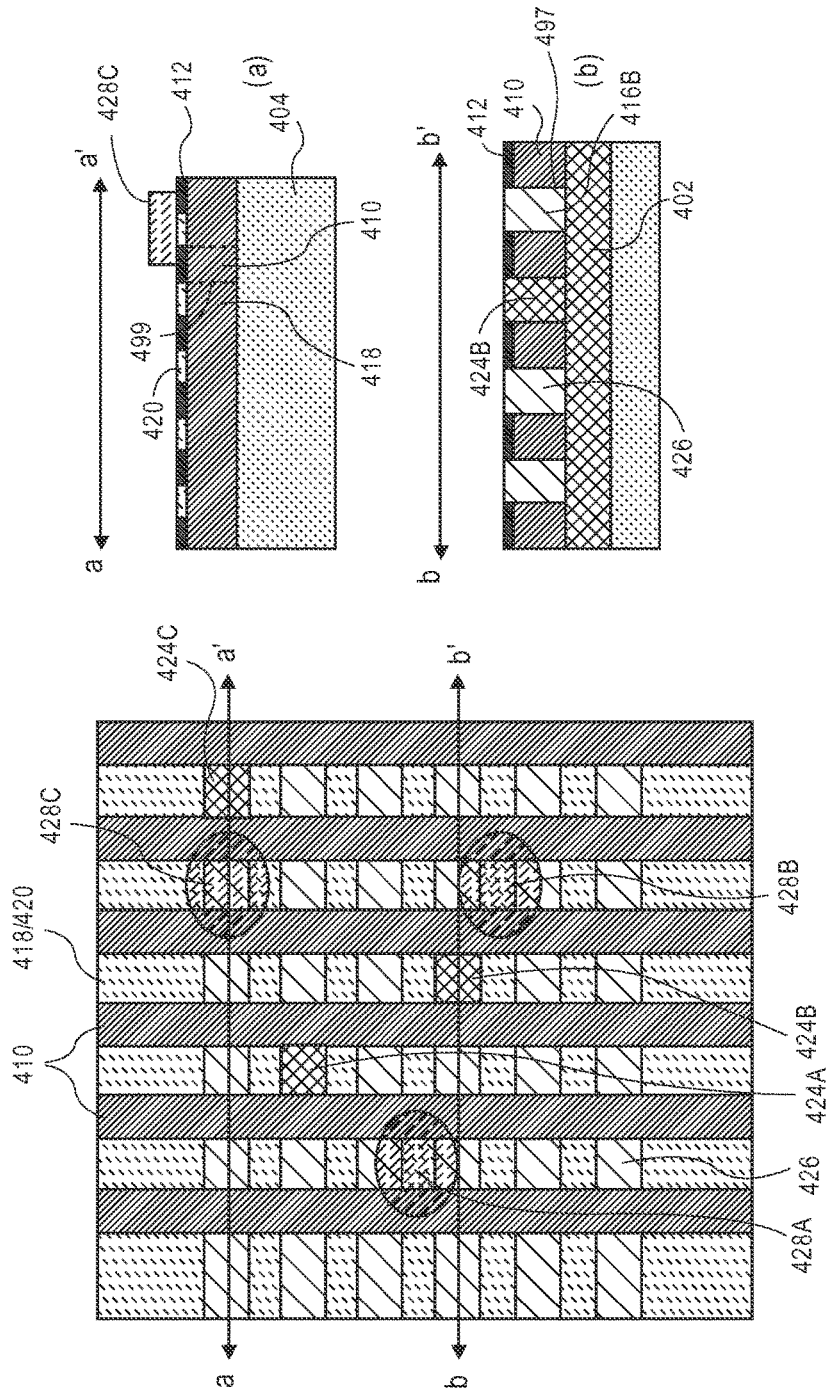

FIG. 4K illustrates a plan view and corresponding cross-sectional views of the structure of FIG. 4J following patterning of a resist or mask in selected plug locations, in accordance with an embodiment of the present invention. Referring to the plan view and corresponding cross-sectional views (a) and (b) taken along axes, a-a' and b-b', respectively, plug positions 428A, 428B and 428C are preserved by forming a mask or resist layer over those locations. Such preservation patterning may be referred to as metal end-to-end lithographic patterning, wherein plug positions are determined where breaks in subsequently formed metal lines are required. It is to be appreciated that since the plug locations can only be in those locations where ILD layer 418/hardmask 420 are positioned, plugs can occur over the previous layer ILD lines 404. In an embodiment, the patterning is achieved by using a lithography operation (e.g., EUV, EBDW or immersion 193 nm). In an embodiment, the process illustrated in FIG. 4K, demonstrates use of a positive tone patterning process where the regions where spaces between metal need to occur are preserved. It is to be appreciated that, in another embodiment, it is also possible to open holes instead and reverse the tone of the process. As an alternative to the process described in association with FIG. 4K, in accordance with an embodiment of the present invention, plugs may be formed in a manner similar to the process described for plug formation in association with FIGS. 1A-1G.

Figure 4L:
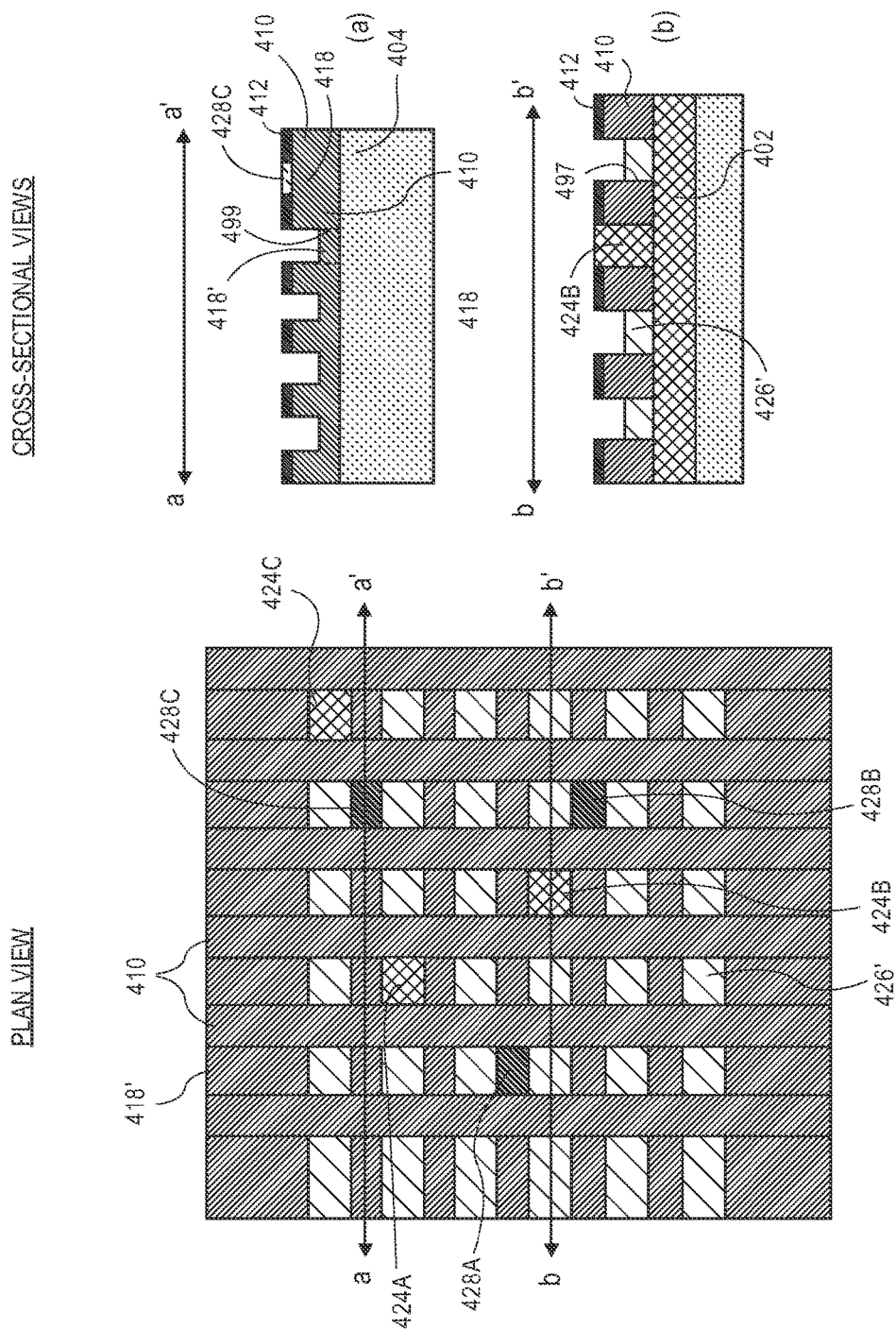

FIG. 4L illustrates a plan view and corresponding cross-sectional views of the structure of FIG. 4K following hardmask removal and ILD layer recessing, in accordance with an embodiment of the present invention. Referring to the plan view and corresponding cross-sectional views (a) and (b) taken along axes, a-a' and b-b', respectively, hardmask 420 is removed and ILD layer 418 and ILD layer 426 are recessed to form recessed ILD layer 418' and recessed ILD layer 426', respectively, by etching of these layers below their original uppermost surfaces. It is to be appreciated that the recessing of ILD layer 418 and ILD layer 426 is performed without etching or recessing ILD lines 410. The selectivity may be achieved by use of a hardmask layer 412 on the ILD lines (as depicted in cross-sectional views (a) and (b)). Alternatively, in a case that the ILD lines 410 are composed of an ILD material different from the material of ILD layer 418 and ILD layer 426, a selective etch may be used even in the absence of a hardmask 412. The recessing of ILD layer 418 and ILD layer 426 is to provide locations for the second level of metal lines, as isolated by ILD lines 410, as described below. The extent or depth of the recess is, in one embodiment, selected based on the desired ultimate thickness of the metal lines formed thereon. It is to be appreciated that the ILD layer 418 in the plug locations 428A, 428B and 428C is not recessed.

Figure 4M:
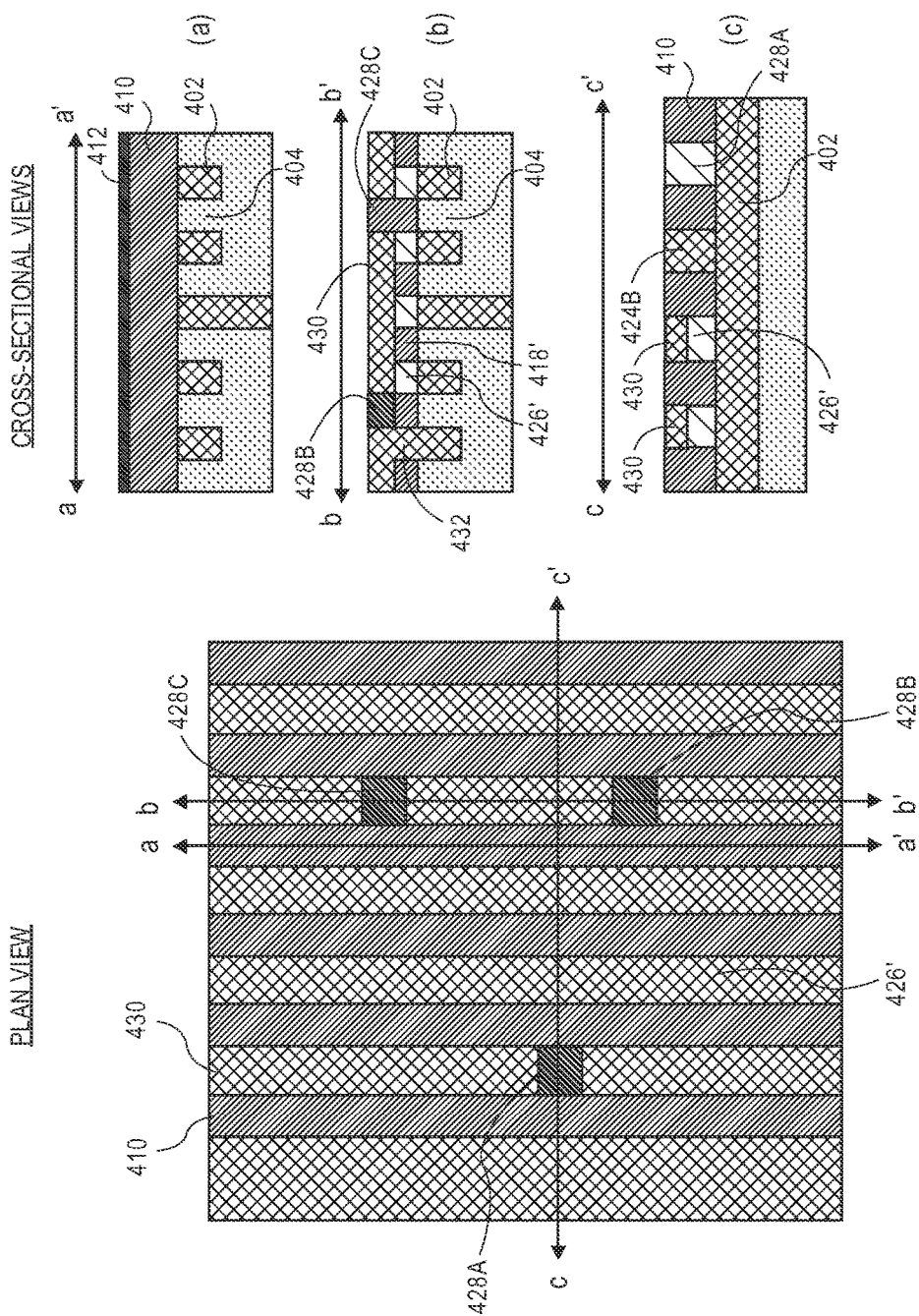

FIG. 4M illustrates a plan view and corresponding cross-sectional views of the structure of FIG. 4L following metal line formation, in accordance with an embodiment of the present invention. Referring to the plan view and corresponding cross-sectional views (a), (b) and (c) taken along axes, a-a', b-b' and c-c', respectively, metal for forming metal interconnect lines is formed conformally above the structure of FIG. 4L. The metal is then planarized, e.g., by CMP, to provide metal lines 430, which are confined to locations above recessed ILD layer 418' and recessed ILD layer 426'. The metal lines 430 are coupled with underlying metal lines 402 through the predetermined via locations 424A, 424B and 424C (424B is shown in cross-sectional view (c); note that for illustrative purposes, another via 432 is depicted directly adjacent plug 428B in cross-sectional view (b) even though this is inconsistent with the previous figures). The metal lines 430 are isolated from one another by ILD lines 410 and are disrupted or broken-up by the preserved plugs 428A, 428B and 428C. Any hardmask remaining on the plug locations and/or on the ILD lines 410 may be removed at this portion of the process flow, as depicted in FIG. 4M. The metal (e.g., copper and associated barrier and seed layers) deposition and planarization process to form metal lines 430 may be that typically used for standard back end of line (BEOL) single or dual damascene processing. In an embodiment, in subsequent fabrication operations, the ILD lines 410 may be removed to provide air gaps between the resulting metal lines 430.

The structure of FIG. 4M may subsequently be used as a foundation for forming subsequent metal line/via and ILD layers. Alternatively, the structure of FIG. 4M may represent the final metal interconnect layer in an integrated circuit. It is to be appreciated that the above process operations may be practiced in alternative sequences, not every operation need be performed and/or additional process operations may be performed. Furthermore, although the above process flow focused on applications of directed self-assembly (DSA), selective growth processes may be used instead in one or more locations of the process flow. In any case, the resulting structures enable fabrication of vias that are directly centered on underlying metal lines. That is, the vias may be wider than, narrower than, or the same thickness as the underlying metal lines, e.g., due to non-perfect selective etch processing. Nonetheless, in an embodiment, the centers of the vias are directly aligned (match up) with the centers of the metal lines. As such, in an embodiment, offset due to conventional lithograph/dual damascene patterning that must otherwise be tolerated, is not a factor for the resulting structures described herein.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 5:
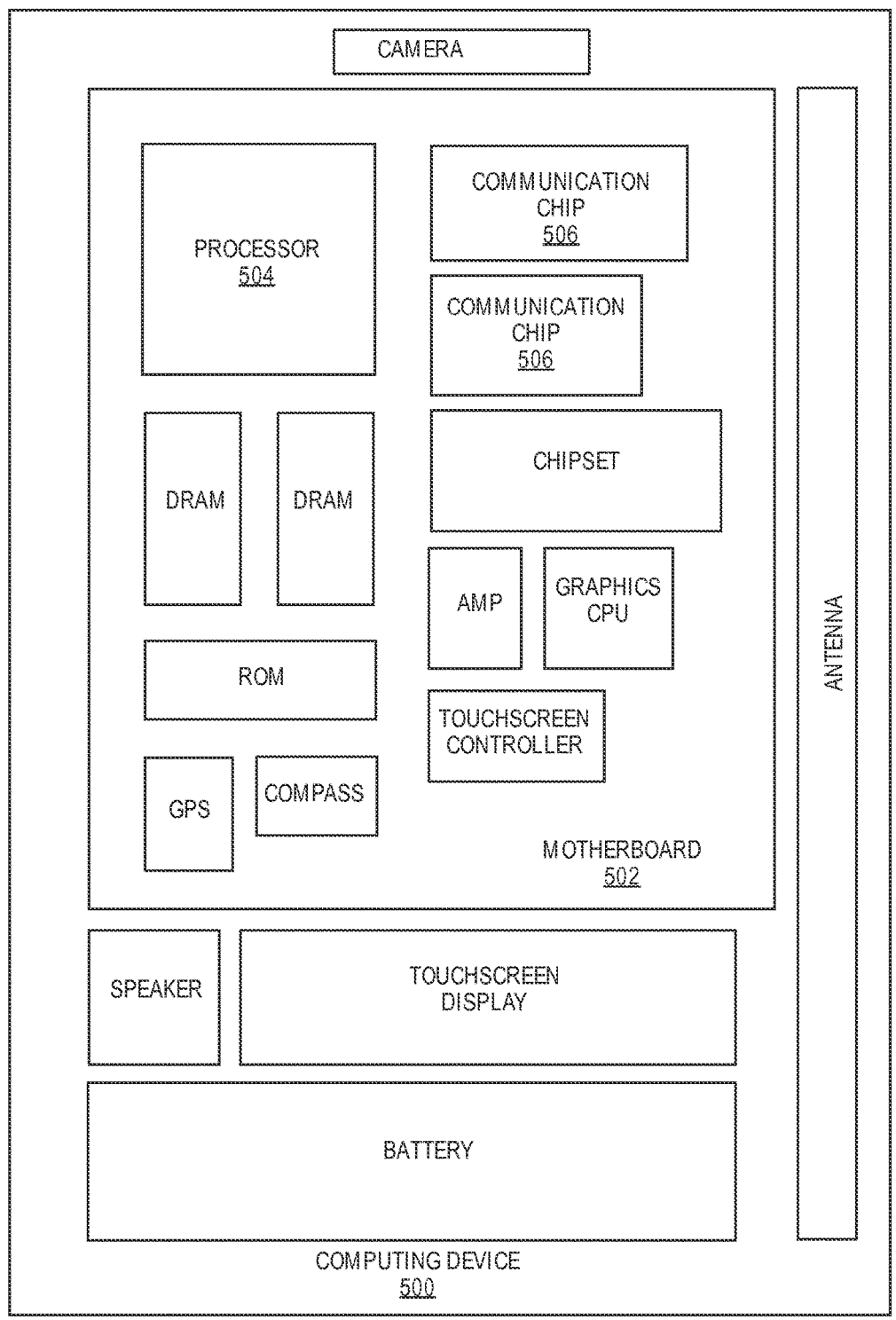
FIG. 5 illustrates a computing device in accordance with one implementation of the invention.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor includes one or more structures, such as self-aligned vias and plugs, built in accordance with implementations of the invention. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip includes one or more structures, such as self-aligned vias and plugs, built in accordance with implementations of the invention.

In further implementations, another component housed within the computing device 500 may contain an integrated circuit die that includes one or more structures, such as self-aligned vias and plugs, built in accordance with implementations of the invention.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
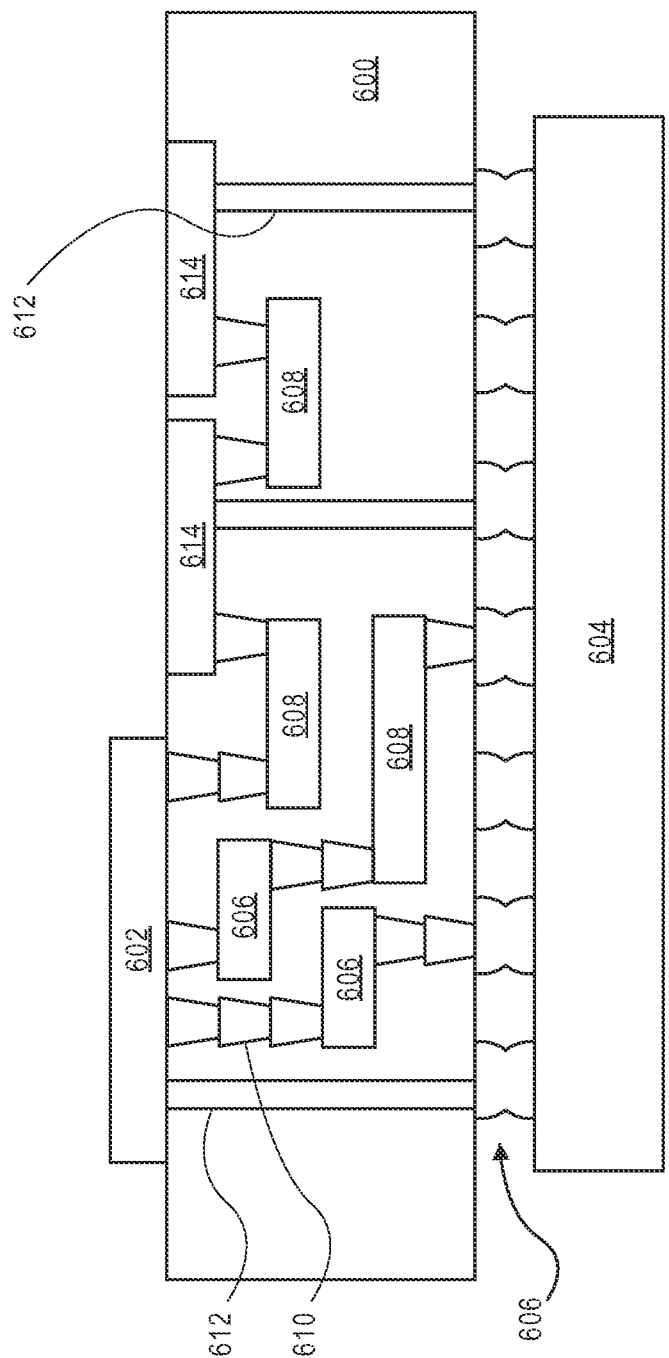
FIG. 6 is an interposer implementing one or more embodiments of the invention.

FIG. 6 illustrates an interposer 600 that includes one or more embodiments of the invention. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with embodiments of the invention, apparatuses or processes disclosed herein may be used in the fabrication of interposer 600.

Thus, embodiments of the present invention include self-aligned isotropic etch processes for via and plug patterning for back end of line (BEOL) interconnects, and the resulting structures.

In an embodiment, a method of fabricating an interconnect structure for an integrated circuit includes providing a previous layer metallization structure comprising metal lines formed in first a first dielectric layer. The method also includes forming a second dielectric layer above the previous layer metallization structure. The method also includes forming a plurality of holes or trenches in the second dielectric layer. The method also includes filling the plurality of holes or trenches with a sacrificial or permanent placeholder material. The method also includes forming a patterning layer above the second dielectric layer and the sacrificial or permanent placeholder material. The method also includes forming openings in the patterning layer to expose a portion of the sacrificial or permanent placeholder material of a subset of the plurality of holes or trenches, each opening smaller than the corresponding portion of the sacrificial or permanent placeholder material of the subset of the plurality of holes or trenches. The method also includes removing the sacrificial or permanent placeholder material of the subset of the plurality of holes or trenches through the openings in the patterning layer. The method also includes removing the patterning layer; and filling the subset of the plurality of holes or trenches with a permanent material.

In one embodiment, removing the sacrificial or permanent placeholder material of the subset of the plurality of holes or trenches through the openings in the patterning layer comprises applying an isotropic etch technique.

In one embodiment, applying the isotropic etch technique comprises using a wet etching process.

In one embodiment, filling the subset of the plurality of holes or trenches with the permanent material comprises filling with a conductive material to form one or more conductive vias for the interconnect structure.

In one embodiment, filling the subset of the plurality of holes or trenches with the permanent material comprises filling with a dielectric material to form one or more plugs for the interconnect structure.

In one embodiment, filling the plurality of holes or trenches with the sacrificial or permanent placeholder material comprises filling the plurality of holes or trenches with a permanent interlayer dielectric material.

In one embodiment, filling the plurality of holes or trenches with the sacrificial or permanent placeholder material comprises filling the plurality of holes or trenches with a sacrificial placeholder material, and the method further incudes, subsequent to filling the subset of the plurality of holes or trenches with the permanent material, removing the remaining sacrificial placeholder material to form one or more re-exposed holes or trenches, and filling the one or more re-exposed holes or trenches with a permanent interlayer dielectric material.

In one embodiment, forming the patterning layer comprises forming a photo-sensitive material, and forming openings in the patterning layer comprises using a lithographic process.

In an embodiment, a method of fabricating an interconnect structure for an integrated circuit includes providing a previous layer metallization structure comprising an alternating metal line and dielectric line grating pattern. The method also includes forming a dielectric structure above the previous layer metallization structure with all possible via locations for the underlying metal lines of the alternating metal line and dielectric line grating pattern filled with a placeholder material. The method also includes forming a mask layer above the dielectric structure. The method also includes patterning the mask layer to expose a portion of the placeholder material of a subset of the possible via locations, each opening smaller than the corresponding placeholder material of the corresponding via location. The method also includes removing the placeholder material of the subset of the possible via locations through the openings in the mask layer. The method also includes removing the mask layer; and filling the subset of the possible via locations with a conductive material.

In one embodiment, forming the mask layer above the dielectric structure comprises forming an oxide mask layer above the dielectric structure.

In one embodiment, the placeholder material comprises a sacrificial placeholder material.

In one embodiment, the sacrificial material is an organic polymer.

In one embodiment, removing the placeholder material of the subset of the possible via locations through the openings in the mask layer comprises applying an isotropic etching process.

In one embodiment, applying the isotropic etching process comprises applying plasma ash or wet cleans process.

In an embodiment, a method of fabricating an interconnect structure for an integrated circuit includes providing a previous layer metallization structure comprising an alternating metal line and dielectric line first grating pattern having a first direction. The method also includes forming a dielectric line second grating pattern above the previous layer metallization structure, the dielectric line second grating pattern having a second direction, perpendicular to the first direction. The method also includes forming a sacrificial structure above the first grating pattern and between the dielectric lines of the second grating pattern. The method also includes replacing portions of the sacrificial structure above and aligned with the metal lines of the first grating pattern with a first dielectric layer, and replacing portions of the sacrificial structure above and aligned with the dielectric lines of the first grating pattern with a second dielectric layer. The method also includes forming a patterning layer above the first and second dielectric layers. The method also includes forming openings in the patterning layer to expose a portion of the first dielectric layer of via locations, each opening smaller than the corresponding portion of the first dielectric layer of the subset of via locations. The method also includes removing the first dielectric layer of the subset of via locations through the openings in the patterning layer. The method also includes removing the patterning layer. The method also includes forming conductive vias in the subset of via locations. The method also includes recessing portions of the first and second dielectric layers. The method also includes forming a plurality of metal lines in the recessed portions of the first and second dielectric layers, coupled with the conductive vias, the plurality of metal lines having the second direction.

In one embodiment, the method further includes forming one or more plug locations in the second dielectric layer.

In one embodiment, removing the first dielectric layer of the subset of via locations comprises applying an isotropic etch technique.

In one embodiment, applying the isotropic etch technique comprises using a wet etching process.

In one embodiment, replacing portions of the sacrificial structure above and aligned with the metal lines of the first grating pattern with the first dielectric layer comprises replacing with a permanent interlayer dielectric material.

In one embodiment, forming the patterning layer comprises forming a photo-sensitive material, and forming openings in the patterning layer comprises using a lithographic process.

What is claimed is:

1. A method of fabricating an interconnect structure for an integrated circuit, the method comprising:
    providing a previous layer metallization structure comprising metal lines formed in first a first dielectric layer;
    forming a second dielectric layer above the previous layer metallization structure;
    forming a plurality of holes or trenches in the second dielectric layer;
    filling the plurality of holes or trenches with a sacrificial or permanent placeholder material;
    forming a patterning layer above the second dielectric layer and the sacrificial or permanent placeholder material;
    forming openings in the patterning layer to expose a portion of the sacrificial or permanent placeholder material of a subset of the plurality of holes or trenches, each opening smaller than the corresponding portion of the sacrificial or permanent placeholder material of the subset of the plurality of holes or trenches;
    removing the sacrificial or permanent placeholder material of the subset of the plurality of holes or trenches through the openings in the patterning layer;
    removing the patterning layer; and
    filling the subset of the plurality of holes or trenches with a permanent material.

2. The method of claim 1, wherein removing the sacrificial or permanent placeholder material of the subset of the plurality of holes or trenches through the openings in the patterning layer comprises applying an isotropic etch technique.

3. The method of claim 2, wherein applying the isotropic etch technique comprises using a wet etching process.

4. The method of claim 1, wherein filling the subset of the plurality of holes or trenches with the permanent material comprises filling with a conductive material to form one or more conductive vias for the interconnect structure.

5. The method of claim 1, wherein filling the subset of the plurality of holes or trenches with the permanent material comprises filling with a dielectric material to form one or more plugs for the interconnect structure.

6. The method of claim 1, wherein filling the plurality of holes or trenches with the sacrificial or permanent placeholder material comprises filling the plurality of holes or trenches with a permanent interlayer dielectric material.

7. The method of claim 1, wherein filling the plurality of holes or trenches with the sacrificial or permanent placeholder material comprises filling the plurality of holes or trenches with a sacrificial placeholder material, the method further comprising:
    subsequent to filling the subset of the plurality of holes or trenches with the permanent material, removing the remaining sacrificial placeholder material to form one or more re-exposed holes or trenches; and
    filling the one or more re-exposed holes or trenches with a permanent interlayer dielectric material.

8. The method of claim 1, wherein forming the patterning layer comprises forming a photo-sensitive material, and wherein forming openings in the patterning layer comprises using a lithographic process.

9. A method of fabricating an interconnect structure for an integrated circuit, the method comprising:
    providing a previous layer metallization structure comprising an alternating metal line and dielectric line grating pattern;
    forming a dielectric structure above the previous layer metallization structure with all possible via locations for the underlying metal lines of the alternating metal line and dielectric line grating pattern filled with a placeholder material;
    forming a mask layer above the dielectric structure;
    patterning the mask layer to expose a portion of the placeholder material of a subset of the possible via locations, each opening smaller than the corresponding placeholder material of the corresponding via location;
    removing the placeholder material of the subset of the possible via locations through the openings in the mask layer;
    removing the mask layer; and
    filling the subset of the possible via locations with a conductive material.

10. The method of claim 9, wherein forming the mask layer above the dielectric structure comprises forming an oxide mask layer above the dielectric structure.

11. The method of claim 9, wherein the placeholder material comprises a sacrificial placeholder material.

12. The method of claim 11, wherein the sacrificial material is an organic polymer.

13. The method of claim 9, wherein removing the placeholder material of the subset of the possible via locations through the openings in the mask layer comprises applying an isotropic etching process.

14. The method of claim 13, wherein applying the isotropic etching process comprises applying plasma ash or wet cleans process.

15. A method of fabricating an interconnect structure for an integrated circuit, the method comprising:
    providing a previous layer metallization structure comprising an alternating metal line and dielectric line first grating pattern having a first direction;
    forming a dielectric line second grating pattern above the previous layer metallization structure, the dielectric line second grating pattern having a second direction, perpendicular to the first direction;

forming a sacrificial structure above the first grating pattern and between the dielectric lines of the second grating pattern;

replacing portions of the sacrificial structure above and aligned with the metal lines of the first grating pattern with a first dielectric layer, and replacing portions of the sacrificial structure above and aligned with the dielectric lines of the first grating pattern with a second dielectric layer;

forming a patterning layer above the first and second dielectric layers;

forming openings in the patterning layer to expose a portion of the first dielectric layer of via locations, each opening smaller than the corresponding portion of the first dielectric layer of the subset of via locations;

removing the first dielectric layer of the subset of via locations through the openings in the patterning layer;

removing the patterning layer;

forming conductive vias in the subset of via locations;

recessing portions of the first and second dielectric layers; and forming a plurality of metal lines in the recessed portions of the first and second dielectric layers, coupled with the conductive vias, the plurality of metal lines having the second direction.

16. The method of claim 15, further comprising:
forming one or more plug locations in the second dielectric layer.

17. The method of claim 15, wherein removing the first dielectric layer of the subset of via locations comprises applying an isotropic etch technique.

18. The method of claim 17, wherein applying the isotropic etch technique comprises using a wet etching process.

19. The method of claim 15, wherein replacing portions of the sacrificial structure above and aligned with the metal lines of the first grating pattern with the first dielectric layer comprises replacing with a permanent interlayer dielectric material.

20. The method of claim 15, wherein forming the patterning layer comprises forming a photo-sensitive material, and wherein forming openings in the patterning layer comprises using a lithographic process.

* * * * *